(12) United States Patent
Schmid et al.

(10) Patent No.: US 11,488,967 B2
(45) Date of Patent: Nov. 1, 2022

(54) EIGHT-TRANSISTOR STATIC RANDOM ACCESS MEMORY CELL

(71) Applicant: GLOBALFOUNDRIES U.S. Inc., Malta, NY (US)

(72) Inventors: Jörg D. Schmid, Dresden (DE); Nigel Chan, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 62 days.

(21) Appl. No.: 17/211,903

(22) Filed: Mar. 25, 2021

(65) Prior Publication Data

US 2022/0310629 A1   Sep. 29, 2022

(51) Int. Cl.
  *G11C 11/417*   (2006.01)
  *H01L 27/11*   (2006.01)
  *G11C 11/412*   (2006.01)

(52) U.S. Cl.
  CPC ........ *H01L 27/1104* (2013.01); *G11C 11/412* (2013.01); *G11C 11/417* (2013.01)

(58) Field of Classification Search
  CPC .. H01L 27/1104; G11C 11/412; G11C 11/417
  See application file for complete search history.

(56) References Cited

U.S. PATENT DOCUMENTS

| | | | |
|---|---|---|---|
| 5,831,897 A | 11/1998 | Hodges | |
| 6,341,083 B1 | 1/2002 | Wong | |
| 7,126,837 B1 * | 10/2006 | Banachowicz | G11C 15/046 257/E27.099 |
| 7,336,533 B2 | 2/2008 | Hunter et al. | |
| 8,294,212 B2 * | 10/2012 | Wang | H01L 27/1116 257/390 |

(Continued)

OTHER PUBLICATIONS

Paul, et al., "Implementation of High Performance of SRAM Cell Using Transmission Gate", International Journal & Magazine of Engineering, Technology, Management and Research, vol. 4, Issue 2, 2017, pp. 859-863.

(Continued)

*Primary Examiner* — Khamdan N. Alrobaie
(74) *Attorney, Agent, or Firm* — David Cain; Hoffman Warnick LLC

(57) ABSTRACT

Disclosed are memory structure embodiments including a memory cell and, particularly, an eight-transistor (8T) static random access memory (SRAM) cell with high device density and symmetry. In the 8T SRAM cell, an isolation region is positioned laterally between two semiconductor bodies. Four gate structures traverse the semiconductor bodies. Four p-type transistors, including two p-type pass-gate transistors and two pull-up transistors between the p-type pass-gate transistors, are on one semiconductor body. Four n-type transistors, including two n-type pass-gate transistors and two pull-down transistors between the n-type pass-gate transistors, are on the other. Adjacent p-type and n-type transistors on the different semiconductor bodies share a gate structure. Various interconnects (including, but not limited to, silicide bridges and/or contact straps) provide the internal and electrical connections required for making the 8T SRAM cell operational and for incorporating the 8T SRAM cell into an array of such cells.

20 Claims, 16 Drawing Sheets

(56) References Cited

U.S. PATENT DOCUMENTS

| | | | |
|---|---|---|---|
| 9,842,634 B2 | 12/2017 | Jeong et al. | |
| 9,922,702 B1 * | 3/2018 | Shanmugam | G11C 11/412 |
| 2005/0111251 A1 * | 5/2005 | Liaw | G11C 11/412 |
| | | | 365/189.11 |
| 2005/0265070 A1 * | 12/2005 | Liaw | G11C 11/4125 |
| | | | 257/E27.098 |
| 2006/0038234 A1 * | 2/2006 | Liaw | H01L 27/1104 |
| | | | 257/E27.099 |
| 2007/0280026 A1 | 12/2007 | Hunter et al. | |
| 2008/0137436 A1 * | 6/2008 | Salter | G11C 16/3418 |
| | | | 365/201 |
| 2010/0315859 A1 * | 12/2010 | Lee | G11C 11/412 |
| | | | 365/230.05 |
| 2011/0075504 A1 * | 3/2011 | Chan | G11C 8/16 |
| | | | 365/154 |
| 2020/0027869 A1 * | 1/2020 | Yeh | H01L 27/11 |

OTHER PUBLICATIONS

Ramesh et al., "Design of Power Efficient High Performance SRAM Cell using Transmission Gates", International Journal of VLSI System Design and Communication Systems, vol. 4, Issue 8, 2016, pp. 569-663.

Sharma et al., "Implementation of high performance SRAM Cell Using Transmission Gate", IEEE Fifth International Conference on Advanced Computing & Communication Technologies, 2015, pp. 257-260.

* cited by examiner

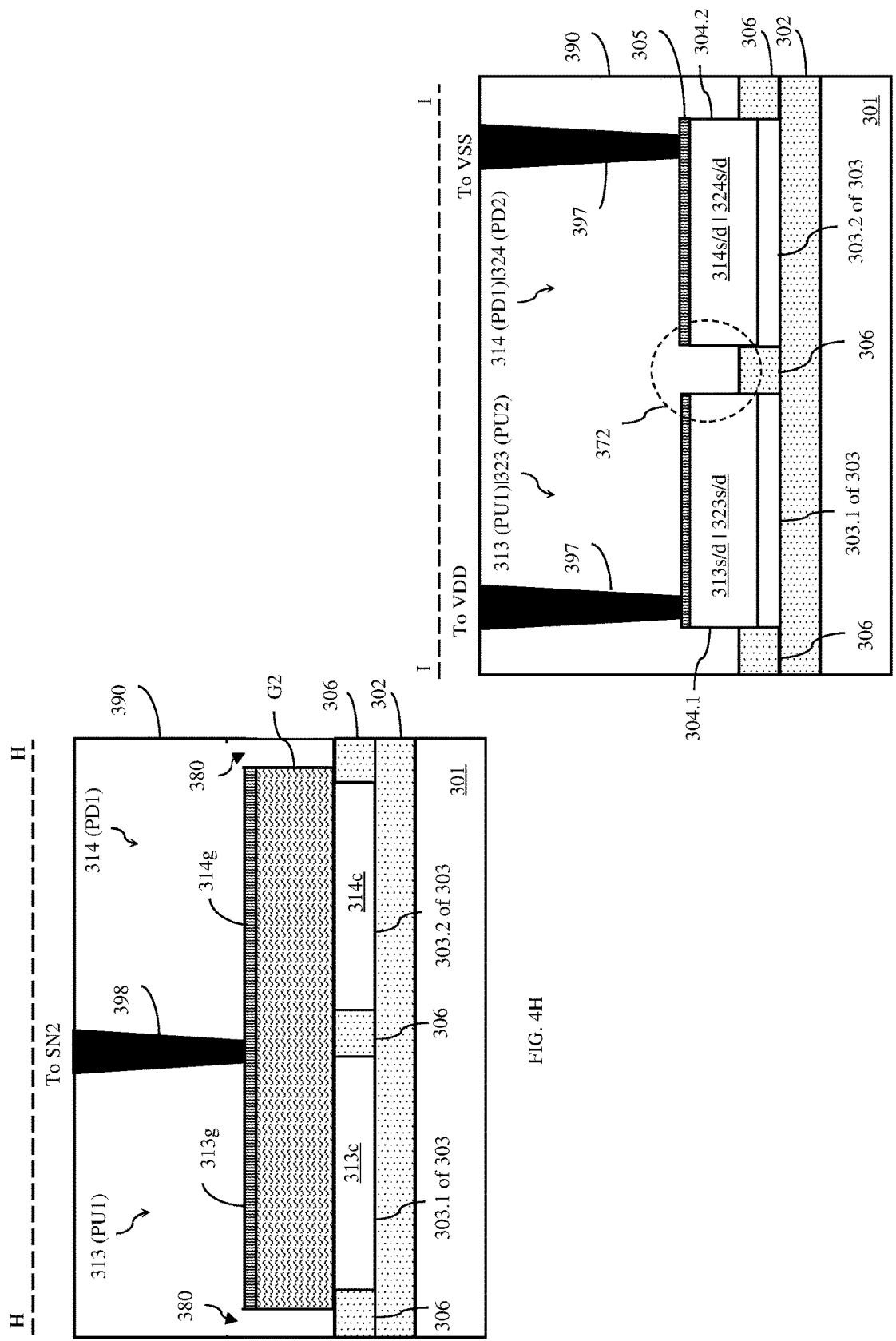

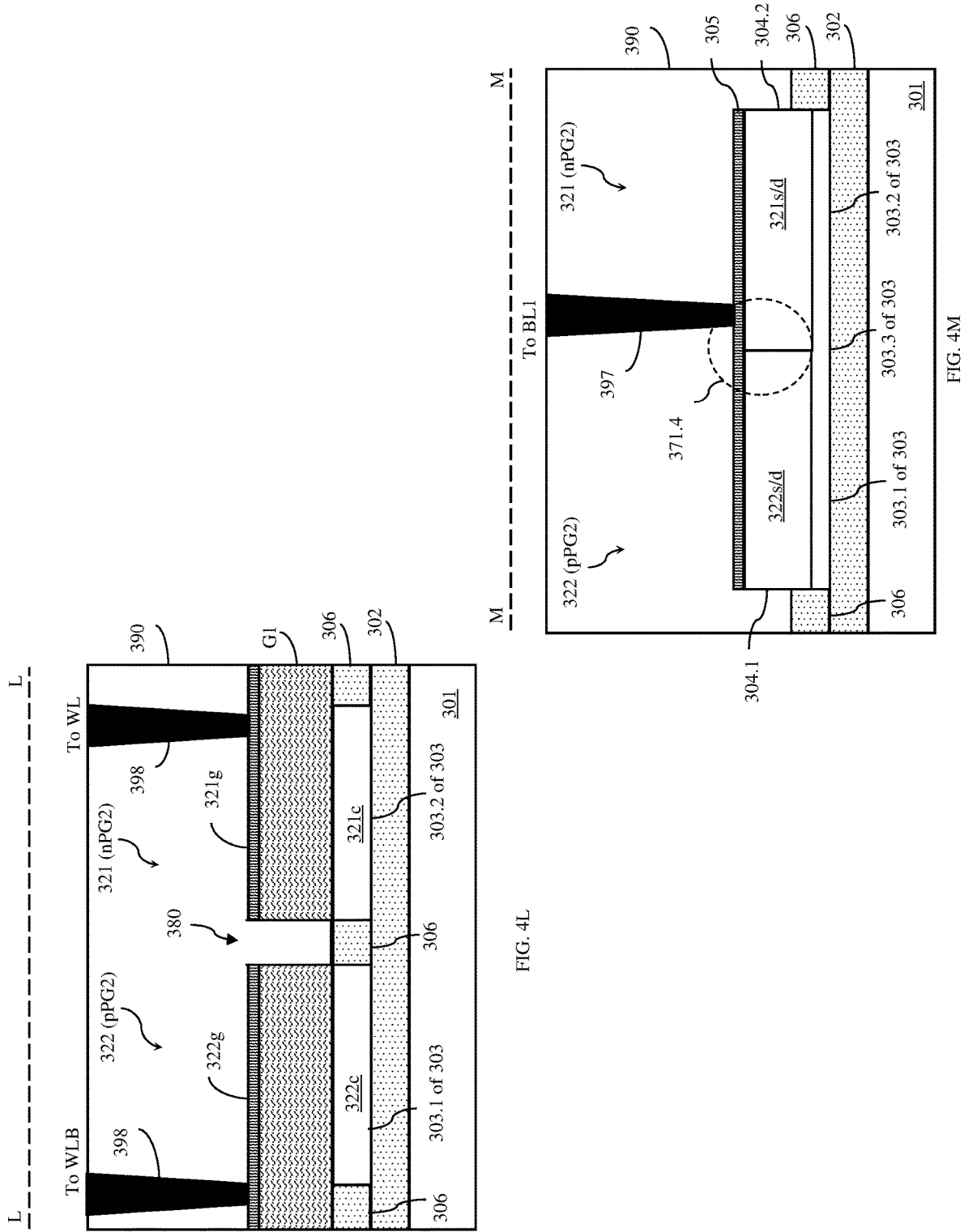

US 11,488,967 B2

EIGHT-TRANSISTOR STATIC RANDOM ACCESS MEMORY CELL

BACKGROUND

Field of the Invention

The present invention relates to memory cells and, particularly, to embodiments of an eight-transistor (8T) static random access memory (SRAM) cell with high device density and symmetry.

Description of Related Art

A conventional six-transistor (6T) static random access memory (SRAM) cell includes: two n-type pass-gate transistors (PG1 and PG2), two n-type pull-down transistors (PD1 and PD2), and two p-type pull-up transistors (PU1 and PU2). Area scaling of the 6T SRAM cell is limited due to the need to pattern four semiconductor bodies (i.e., one for PG1 and PD1, one for PU1, one for PU2, and one for PD2 and PG2) and further due to the need for L-shaped local interconnects to provide electrical connections required for storage node creation. Recently, a high performance eight-transistor (8T) SRAM cell has been developed. In the 8T SRAM cell, PG1 and PG2 are replaced by two transmission gates (TG1 and TG2). Each transmission gate includes two transistors and, particularly, parallel-connected n-type and p-type pass-gate transistors with gates connected to two different wordlines, respectively, where the signals on the different wordlines are inverted with respect to each other. Replacing PG1 and PG2 with TG1 and TG2 reduces leakage current and delay and improves data stability but increases chip area consumption.

SUMMARY

Generally, disclosed herein are embodiments of a memory structure including a substrate and, on the substrate, an array of memory cells arranged in columns and rows. Each memory cell can include a first semiconductor body and a second semiconductor body, which is adjacent and parallel to the first semiconductor body. An isolation region can be positioned laterally between the first semiconductor body and the second semiconductor body. The memory cell can further include four gate structures, which traverse the first semiconductor body, the isolation region, and the second semiconductor body. The memory cell can further include eight transistors and, particularly, four p-type transistors on the first semiconductor body and four n-type transistors on the second semiconductor body. Each of the four gate structures can be common to one of the p-type transistors and to adjacent an adjacent one of the n-type transistors. That is, each gate structure can have a first section and, particularly, a gate for a p-type transistor on the first semiconductor body and a second section and, particularly, a gate for an n-type transistor on the second semiconductor body.

More specifically, disclosed herein are embodiments of a memory structure including a substrate and, on the substrate, an array of eight-transistor (8T) static random access memory (SRAM) cells. Each 8T SRAM cell can include a first semiconductor body and a second semiconductor body, which is adjacent and parallel to the first semiconductor body. An isolation region can be positioned laterally between the first semiconductor body and the second semiconductor body. The 8T SRAM cell can further include four gate structures, which are perpendicular to and traverse the first semiconductor body, the isolation region, and the second semiconductor body. The 8T SRAM cell can further include eight transistors and, particularly, four p-type transistors on the first semiconductor body and four n-type transistors on the second semiconductor body. The four p-type transistors can include, in order across the first semiconductor body, a first p-type pass-gate transistor, a first p-type pull-up transistor adjacent to the first p-type pass-gate transistor, a second p-type pull-up transistor adjacent to the first p-type pull-up transistor, and a second p-type pass-gate transistor adjacent to the second p-type pull-up transistor. The four n-type transistors can include, in order across the second semiconductor body, a first n-type pass-gate transistor, a first n-type pull-down transistor adjacent to the first n-type pass-gate transistor, a second n-type pull-down transistor adjacent to the first n-type pull-down transistor, and a second n-type pass-gate transistor adjacent to the second n-type pull-down transistor. Each of the four gate structures can be common to one of the p-type transistors and to adjacent an adjacent one of the n-type transistors. That is, each gate structure can have a first section and, particularly, a gate for a p-type transistor on the first semiconductor body and a second section and, particularly, a gate for an n-type transistor on the second semiconductor body.

Within the 8T SRAM cell, a common p-type source/drain region of the first p-type pass-gate transistor and the first p-type pull-up transistor can be electrically connected (e.g., by a silicide bridge or a contact strap) to common n-type source/drain region of the first n-type pass-gate transistor and the first n-type pull-down transistor to form a first storage node. The first storage node can further be electrically connected to a common gate structure of the second p-type pull-up transistor and the second n-type pull-down transistor. Additionally, a common p-type source/drain region of the second p-type pass-gate transistor and the second p-type pull-up transistor can be electrically connected (e.g., by a silicide bride or a contact strap) to a common n-type source/drain region of the second n-type pass-gate transistor and the second n-type pull-down transistor to form a second storage node. The second storage node can further be electrically connected to a common gate structure of the first p-type pull-up transistor and the first n-type pull-down transistor.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 4B-4N are cross-section diagrams BB-MM, respectively, of the 8T SRAM cell shown in FIG. 4A;

FIG. 4N illustrates an alternative structure for the cross-section diagrams EE, GG, KK, and MM when the structure shown in FIG. 4O is employed;

DETAILED DESCRIPTION

Figure 1:
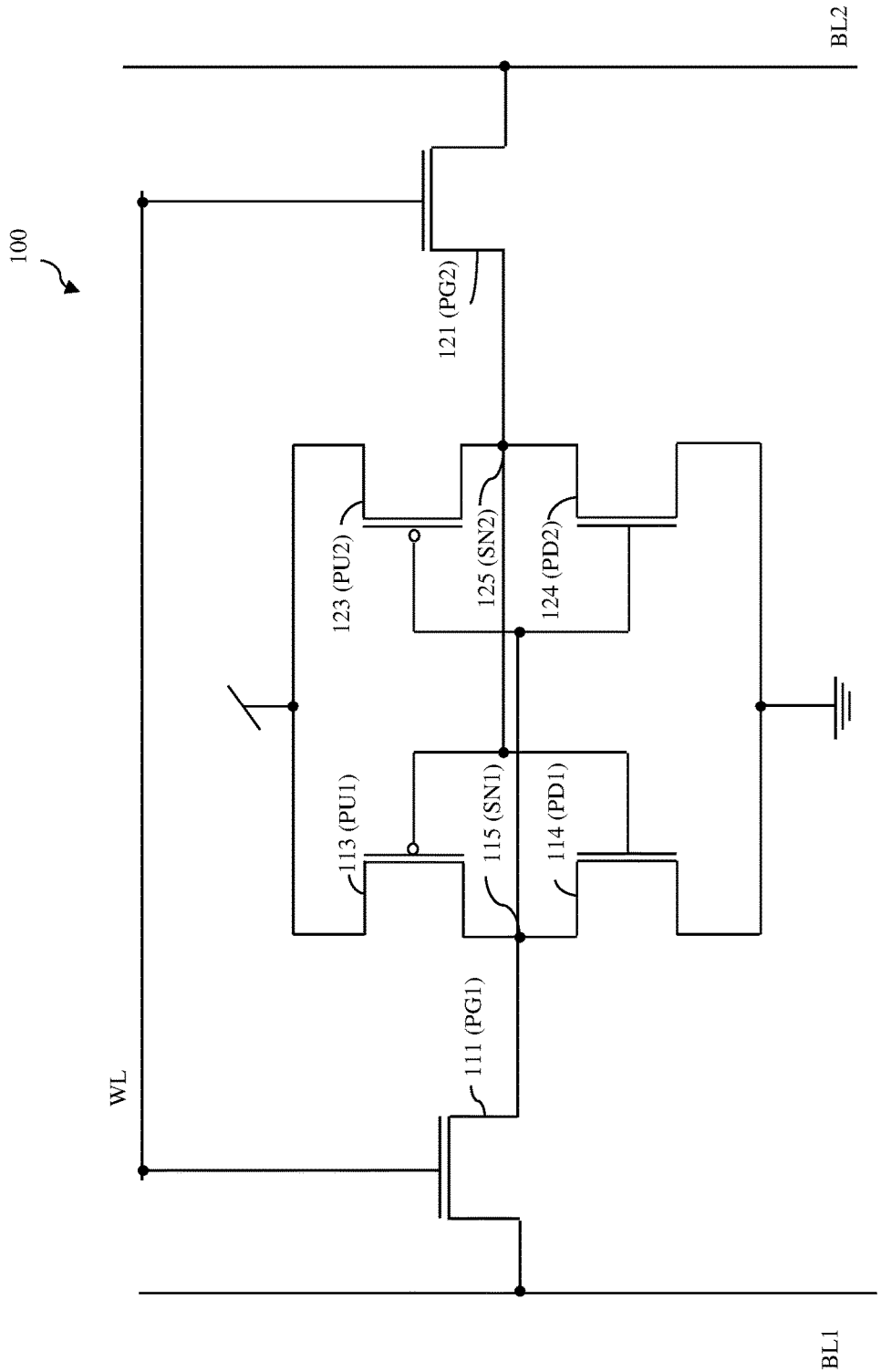
FIG. 1 is a circuit diagram illustrating a six-transistor (6T) static random access memory (SRAM) cell.
Figure 2:
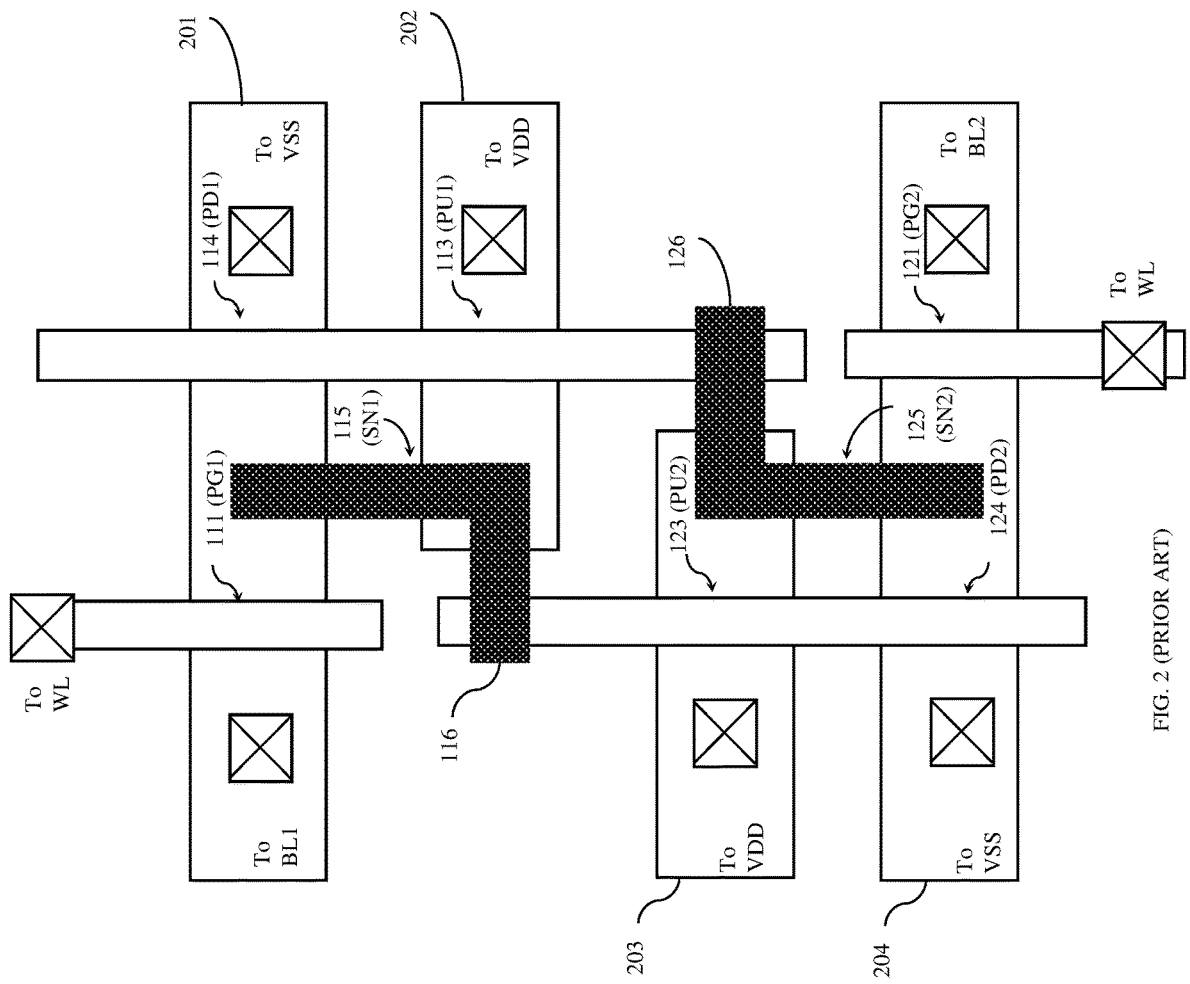
FIG. 2 is a layout diagram for the 6T SRAM cell of FIG. 1.

FIG. 1 is a circuit diagram illustrating a conventional six-transistor (6T) static random access memory (SRAM) cell 100 of an array of 6T-SRAM cells (not shown). The 6T SRAM cell 100 includes a pair of n-type pass-gate transistors (PG1 111 and PG2 121) and a pair of cross-coupled inverters. Each inverter can include a p-type pull-up transistor (PU1 113, PU2 123) connected in series to a n-type pull-down transistor (PD1 114, PD2 124). The drain of PG1 111 can be connected to a data storage node (SN1 115) between PU1 113 and PD1 114 and the drain of PG2 121 can be connected to another data storage node (SN2 125) between PU2 123 and PD2 124 of the other inverter. Furthermore, the source of PG1 111 can be connected to a first bitline (BL1) of a complementary pair of bitlines for a given column in the array and the source of PG2 121 can be connected to a second bitline (BL2) of the complementary pair of bitlines for the given column. The gates of PG1 111 and PG2 121 can be connected to the same wordline (WL) for a given row in the array. Such a 6T SRAM cell 100 can operate in three different stages: standby, write and read. In the standby state, the cell is idle. In the write stage, a data value is written into the cell. Specifically, if a data value of "1" is to be written to SN1 115, a high voltage level (e.g., VDD) is applied to the BL1 and BL2 is discharged to ground. Then, WL is activated (e.g., driven to VDD) to concurrently turn on PG1 111 and PG2 121 and the data value "1" is stored at SN1 115. Contrarily, if a data value of "0" is to be written to the SN1 115, BL1 is discharged to ground and a high voltage level (e.g., VDD) is applied to the BL2. Then, WL is activated to concurrently turn on PG1 111 and PG2 121 and the data value "0" is stored at SN1 115. In the reading stage, the data value stored at SN1 115 is read out. Specifically, BL1 and BL2 are both pre-charged to a high voltage level (e.g., to VDD) and the WL is activated (e.g., driven to VDD) to concurrently turn on PG1 111 and PG2 121. When a data value of "1" is stored on SN1 115, BL1 will remain charged at its pre-charge high voltage level and the voltage level on BL2 will drop as current flows through PD2 124 and PG2 121. When a data value of "0" is stored on SN1 115, the voltage level on BL1 will drop as current flows through PD1 114 and PG1 111 and BL2 will remain charged at its pre-charge high voltage level. A sense amplifier can sense the voltage differential between the two bitlines (i.e., whether the voltage level on BL1 or BL2 has dropped) and thereby will sense the stored data value. FIG. 2 is an exemplary layout diagram for the 6T SRAM cell 100. As illustrated, area scaling of the 6T SRAM cell is limited due to the need to pattern four parallel semiconductor bodies 201-204 (i.e., one for PG1 and PD1, one for PU1, one for PU2, and one for PD2 and PG2) and further due to the need for L-shaped local interconnects 116 and 126 to provide electrical connections required for data storage node creation. Recently, high performance eight-transistor (8T) SRAM cells have been developed. An 8T SRAM cell is configured essentially the same as the 6T SRAM cell, as described above, and operates essentially the same except that the pass-gate transistors (i.e., PG1 111 and PG2 121) are replaced by a pair of transmission gates. Replacing the pass-gate transistors of with transmission gates reduces leakage current and delay and improves data stability. However, due to the added transistors of the transmission gates, chip area consumed by an 8T SRAM cell is typically significantly larger than the chip area consumed by a 6T SRAM cell. Thus, the chip area consumed by a typical array of 8T SRAM cells is significantly larger than the chip area consumed by an array of 6T SRAM cells.

In view of the foregoing, disclosed herein are embodiments of a memory structure including a memory cell and, particularly, an eight-transistor (8T) static random access memory (SRAM) cell with high device density and symmetry. The layout of the 8T SRAM cell in particular avoids a significant increase in area consumption over a conventional 6T SRAM cell despite the added transistors for transmission gates. Specifically, in the 8T SRAM cell, two elongated and parallel semiconductor bodies can be separated by an isolation region. Four gate structures can traverse the semiconductor bodies and the isolation region between them. Four p-type transistors (pFETs), including two p-type pass-gate transistors and two pull-up transistors between the two p-type pass-gate transistors, can be on one semiconductor body. Four n-type transistors (nFETs), including two n-type pass-gate transistors and two pull-down transistors between the two n-type pass-gate transistors, can be on the other semiconductor body. Each pair of adjacent p-type and n-type transistors can share a corresponding one of the gate structures (i.e., can have a common gate structure). As described in greater detail below, various interconnects (including, but not limited to, silicide bridges and/or contact straps) provide the required internal and external electrical connections for making the 8T SRAM cell operational and for incorporating the 8T SRAM cell into an array of such cells.

Figure 3A:
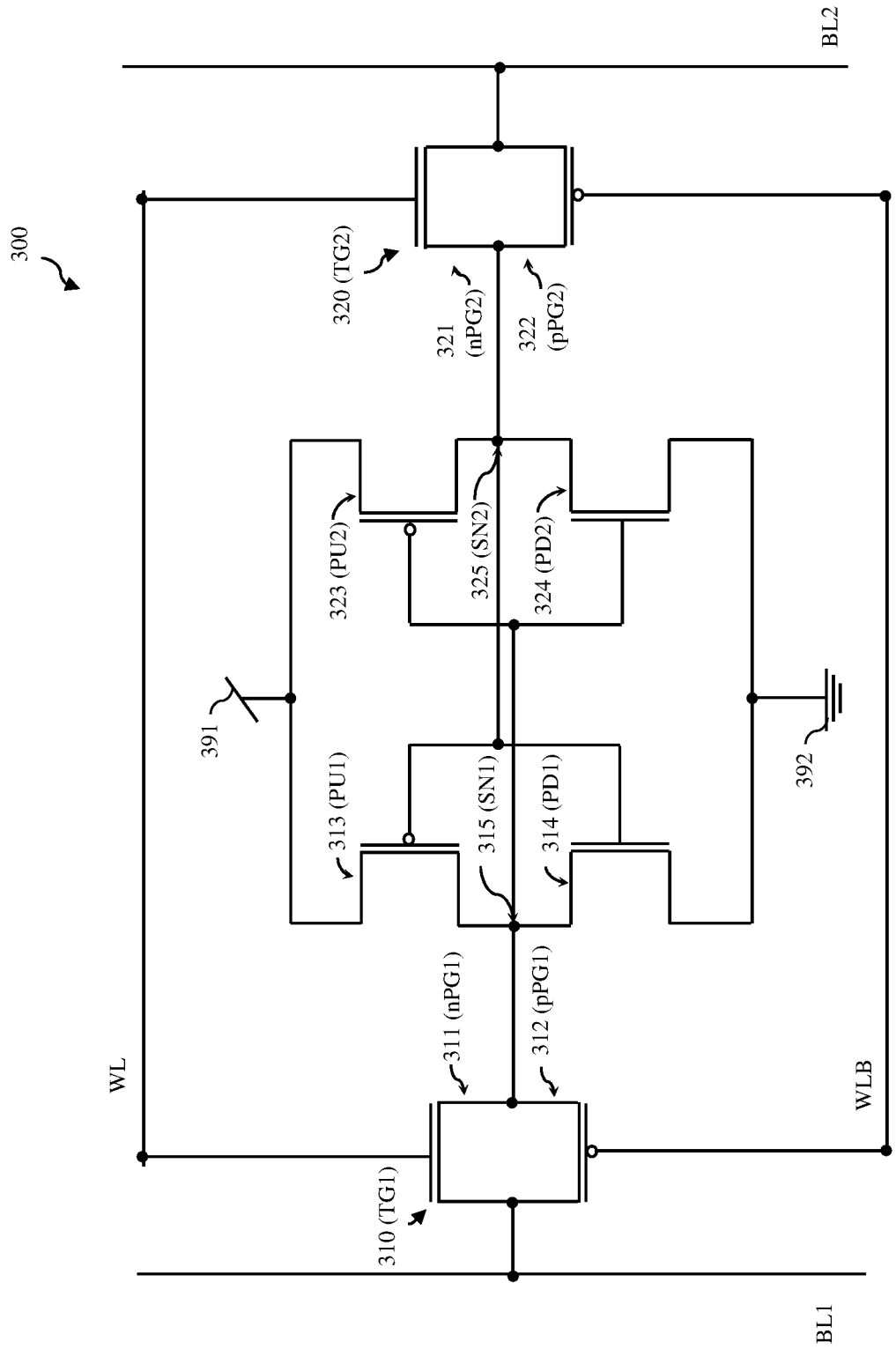
FIG. 3A is a circuit diagram illustrating an eight-transistor (8T) SRAM cell.
Figure 3B:
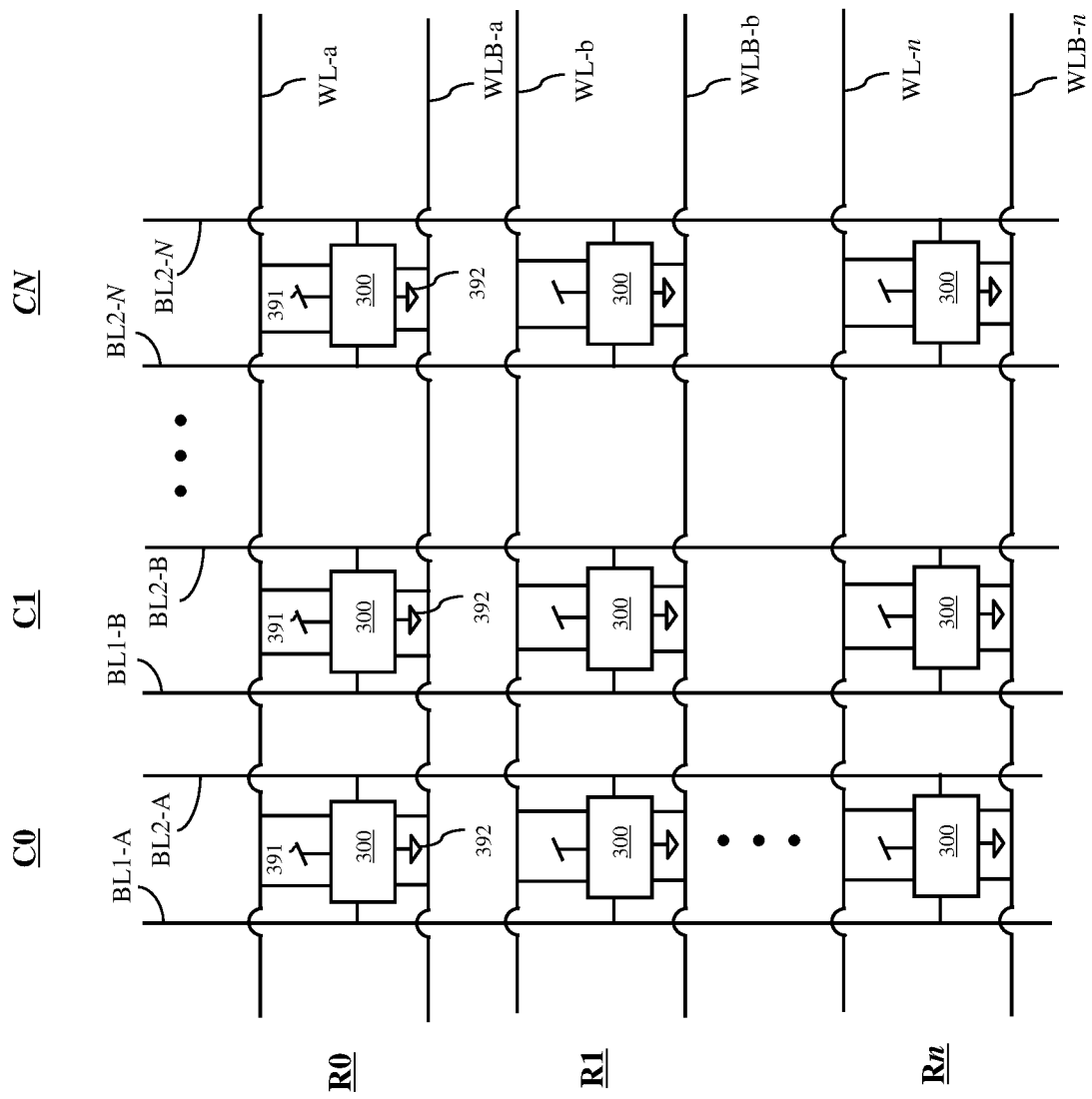
FIG. 3B is a circuit diagram illustrating a memory structure including an array of 8T SRAM cells.

FIG. 3A is a circuit diagram illustrating an eight-transistor (8T) SRAM cell 300. FIG. 3B is a circuit diagram illustrating a memory structure including an array of 8T-SRAM cells 300 arranged in columns C0-CN and rows R0-Rn, where each 8T SRAM cell 300 in a given column is connected to a pair of complementary bitlines for that given column (e.g., see BL1-A and BL2-A of column A; BL1-B and BL2-B of column B; and so on) and where each 8T SRAM cell 300 in a given row is connected to a pair of wordlines for that given row (e.g., see WL-a and WLB-a of row a; WL-b and WLB-b of row b; and so on). Generally, each 8T SRAM cell 300 in the array includes a pair of transmission gates (i.e., a first transmission gate (TG1) 310 and a second transmission gate (TG2) 320). TG1 can include a first n-type pass-gate transistor (nPG1) 311 and a first p-type pass-gate transistor (pPG1) 312 connected in parallel between a first bitline (BL1) (also referred to herein as a true bitline) for a column and a first storage node (SN1) 315. TG2 can include a second n-type pass-gate transistor (nPG2) 321 and a second p-type pass-gate transistor (pPG2) 322 connected in parallel between a second bitline (BL2) (also referred to herein as a complement bitline) for the same column and a second storage node (SN2) 325. The gates of nPG1 311 of TG1 and nPG2 321 of TG2 can be connected to the same first wordline (WL) for a row. The gates of pPG1 312 of TG1 and apPG2 322 of TG2 can be connected to the same second wordline (WLB) for the same row, which is inverted with respect to WL. Additionally, each 8T SRAM cell 300 includes pair of cross-coupled inverters. Specifically, each 8T SRAM cell includes a first inverter and a second inverter. The first inverter can include a first p-type pull-up transistor (PU1) 313 and a first pull-down transistor (PD1) 314 connected in series between a first voltage rail 391 (e.g., a positive voltage rail at VDD or, alternatively, at VCS) and a second voltage rail 392 (e.g., a ground or negative voltage rail at VSS). A second inverter can include a second p-type pull-up transistor (PU2) 323 and a second pull-down transistor (PD2) 324 connected in series between the first voltage rail 391 and the second voltage rail 392. SN1 315 can be located at the junction between PU1 313 and PD1 314 and can further be connected to the gates of the PU2 and PD2. SN2 325 can be located at the junction between PU2 323 and PD2 324 and can further be connected to the gates of PU1 and PD1.

The 8T SRAM cell 300 can operate in three different stages: standby, write and read. In the standby state, the cell 300 is idle. In the write stage, a data value of "1" or "0" is written onto SN1. Specifically, if a data value of "1" (i.e., a high data value) is to be written onto SN1 315, a high voltage level (e.g., VDD) is applied to BL1 and BL2 is discharged to ground. Then, WL is activated (e.g., driven to VDD) and WLB is discharged to ground, thereby concurrently turning on nPG1 311 and pPG1 312 of TG1 and nPG2 321 and pPG2 322 of TG2. As a result, current will only flow from BL1 (which is high) through TG1 to SN1 315, thereby storing a "1" on SN1 315. The high voltage level on SN1 315 will turn off PU2 323 and turn on PD2 324, thereby ensuring SN2 325 is maintained at a low voltage level. The low voltage level on SN2 325 will turn on PU1 313 and turn off PD1 314, thereby ensuring that SN1 315 is maintained at the high voltage level. Contrarily, if a "0" (i.e., a low data value) is to be written to the SN1 315, BL1 is discharged to ground and a high voltage level (e.g., VDD) is applied to BL2. Then, WL is activated (e.g., driven to VDD) and WLB is discharged to ground, thereby concurrently turning on nPG1 311 and pPG1 312 of TG1 and nPG2 321 and pPG2 322 of TG2. As a result, current will only flow from BL2 (which is high) through TG2 to SN2 325, thereby causing SN2 325 to go high. The high voltage level on SN2 325 will turn off PU1 313 and turn on PD1 314, thereby ensuring SN1 315 is maintained at a low voltage level (i.e., stores a "0"). The low voltage level on SN1 315 will turn on PU2 323 and turn off PD2 324, thereby ensuring that SN2 325 is maintained at the high voltage level. In the reading stage, the data value stored at SN1 315 is read out. Specifically, BL1 and BL2 are both pre-charged to high voltage levels. Next, WL is activated (e.g., driven to VDD), and WLB is discharged to ground, thereby concurrently turning on TG1 and TG2. When a data value of "1" is stored in the 8T SRAM cell 300, SN1 315 is at a high voltage level and SN2 325 is at a low voltage level. As a result, BL1 will remain charged at its pre-charged high voltage level, but the voltage level on BL2 will drop through TG2 320 and PD2 324. When a data value of "0" is stored in the 8T SRAM cell 300, SN1 315 is at a low voltage level and SN2 325 is at a high voltage level. As a result, BL2 will remain charged at its pre-charged high voltage level, but the voltage level on BL1 will drop through TG1 310 and PD1 314. A sense amplifier can sense whether BL1 or BL2 is higher after the read and thereby will sense the stored data value.

As mentioned above, replacing the pass gate transistors of a 6T SRAM cell (e.g., as shown in FIG. 1) with transmission gates to form an 8T SRAM cell (e.g., as shown in FIG. 3A) reduces leakage current and delay and improves data stability. However, due to the added transistors of the transmission gates, chip area consumed by an 8T SRAM cell is typically significantly larger than the chip area consumed by a 6T SRAM cell. Thus, the chip area consumed by an array of 8T SRAM cells is typically significantly larger than the chip area consumed by an array of 6T SRAM cells. In order to avoid this increase in chip area consumption and still achieve reduced leakage current and delay and improved data stability, disclosed herein are embodiments of a memory structure where each 8T SRAM cell 300 and the memory array that incorporates the 8T SRAM cells 300 have unique layouts and, thereby unique structures that allow for a significant increase in device density (e.g., the number of transistors per unit area) and symmetry over prior art memory structures with 8T SRAM cells.

Figure 5:
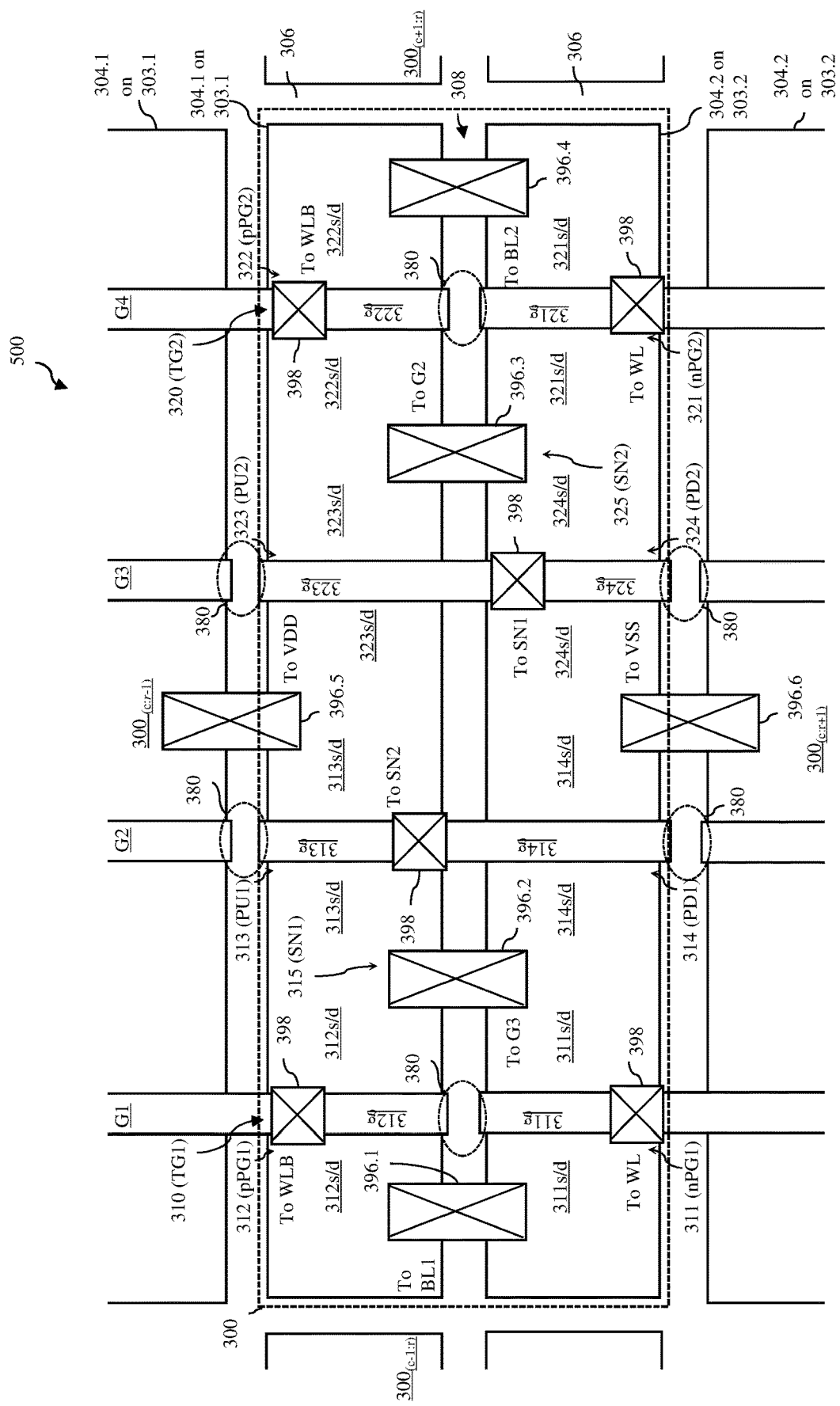
FIG. 5 is a layout diagram illustrating another disclosed embodiment of an 8T SRAM cell incorporated into a column and a row of another disclosed embodiment of an 8T SRAM array of a memory structure.
Figure 6:
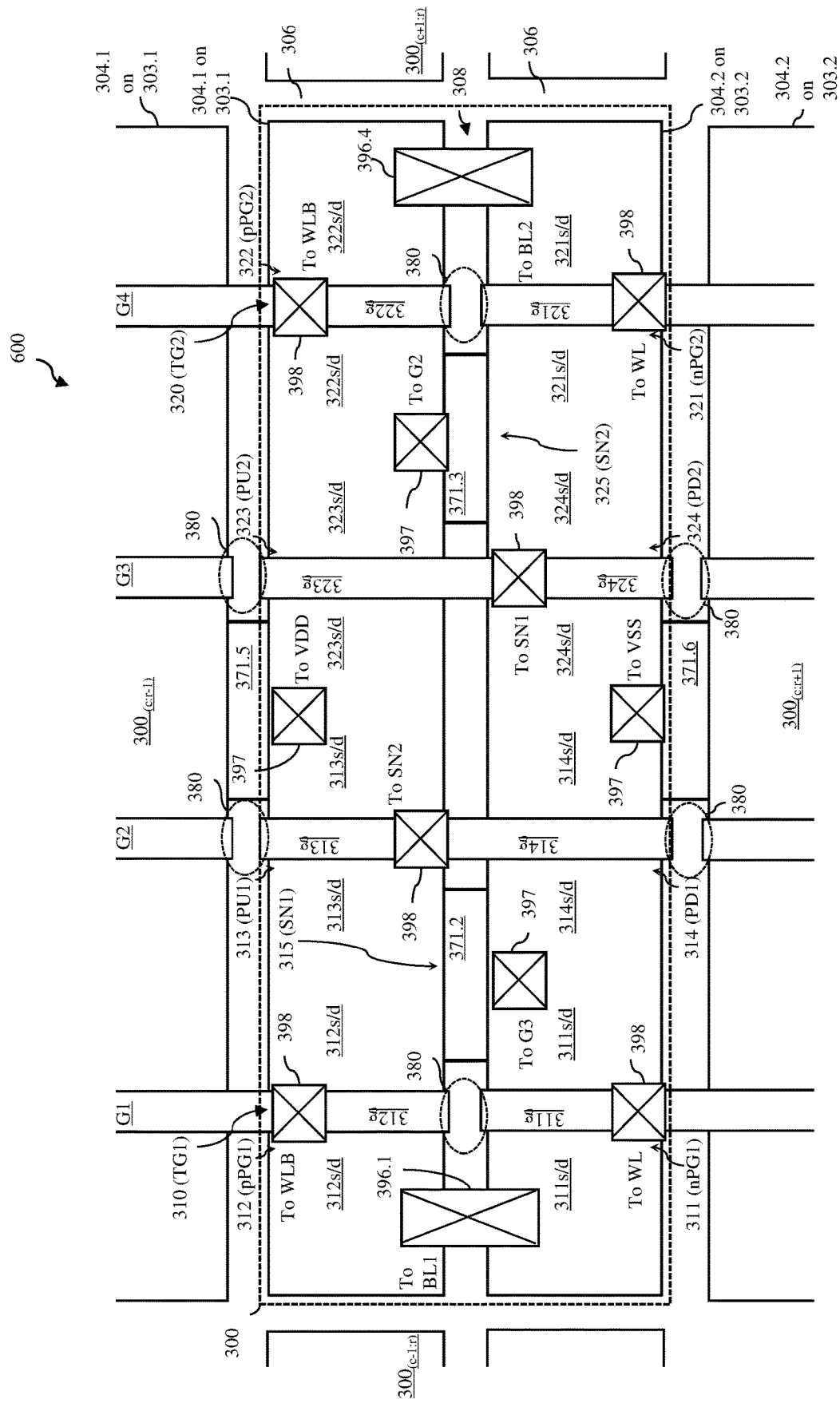
FIG. 6 is a layout diagram illustrating yet another disclosed embodiment of an 8T SRAM cell incorporated into a column and a row of yet another disclosed embodiment of an 8T SRAM array of a memory structure.

More specifically, disclosed herein are embodiments of a memory structure 400 (see FIGS. 4A-4M), a memory structure 500 (see FIG. 5), and a memory structure 600 (see FIG. 6). The memory structure 400, 500, 600 can be a semiconductor-on-insulator structure (e.g., a silicon-on-insulator (SOI) structure), as illustrated. That is, the memory structure 400, 500, 600 can include: a semiconductor substrate 301 (e.g., a silicon substrate or some other suitable substrate); an insulator layer 302 (e.g., a silicon dioxide layer, referred to herein as a buried oxide or BOX layer, or some other suitable insulator layer) on the substrate 301; and a semiconductor layer 303 (e.g., a silicon layer) on the insulator layer 302. In this case, the 8T SRAM cells 300 of the array can be formed from the semiconductor layer above the insulator layer 302. Alternatively, the memory structure 400, 500, 600 can be a bulk semiconductor structure (e.g., a bulk silicon structure). In this case, the 8T SRAM cells 300 of the array can be formed from an upper portion of the substrate, which is electrically isolated from a lower portion by, for example, buried well region (not shown).

Figure 4A:
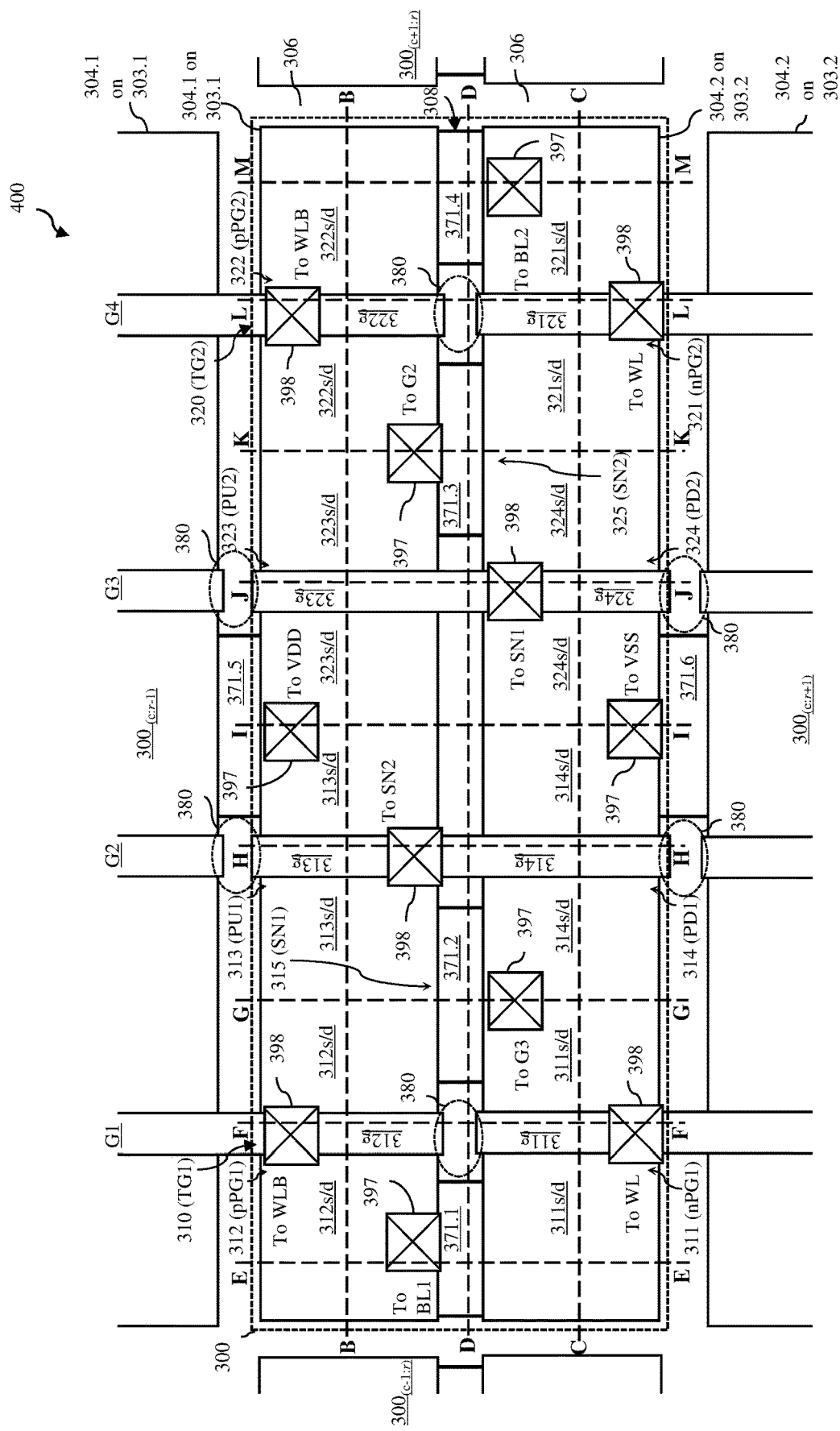
FIG. 4A is a layout diagram illustrating a disclosed embodiment of an 8T SRAM cell incorporated into a column and a row of a disclosed embodiment of an 8T SRAM array of a memory structure.

It should be noted that, for purposes of illustration, FIGS. 4A, 5 and 6 show, in detail, the layout of one 8T SRAM cell 300 within a given column (c) and a given row (r) of an array. Within the given column (c), the 8T SRAM cell 300 can be positioned laterally between and adjacent to an 8T SRAM cell $300_{(c:r-1)}$ in an adjacent row above (i.e., in r−1) and/or to an 8T SRAM cell $300_{(c:r+1)}$ in an adjacent row below (i.e., in r+1). Any two adjacent memory cells within a column will be symmetrically oriented, as discussed further below. Within the given row (r), the 8T SRAM cell 300 can be positioned laterally between and adjacent to an 8T SRAM cell $300_{(c-1:r)}$ in an adjacent column to the left (i.e., in c−1) and/or to an 8T SRAM cell $300_{(c+1:r)}$ in an adjacent column to the right (i.e., in c+1).

Figure 4B:
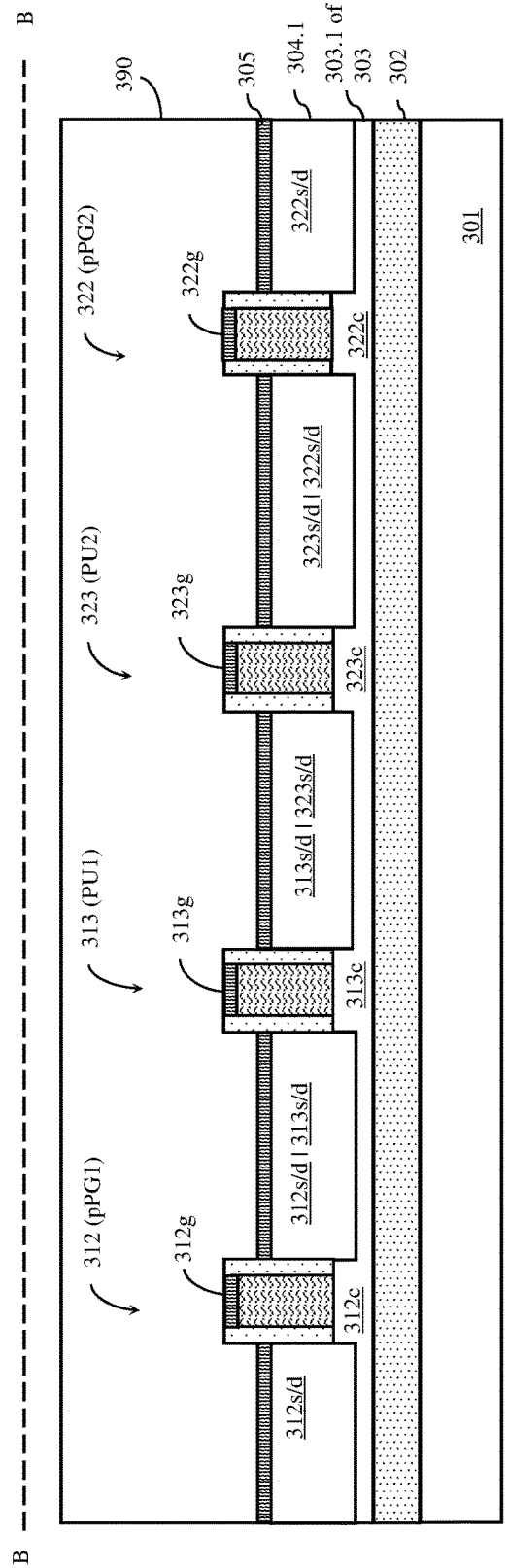
Figure 4C:
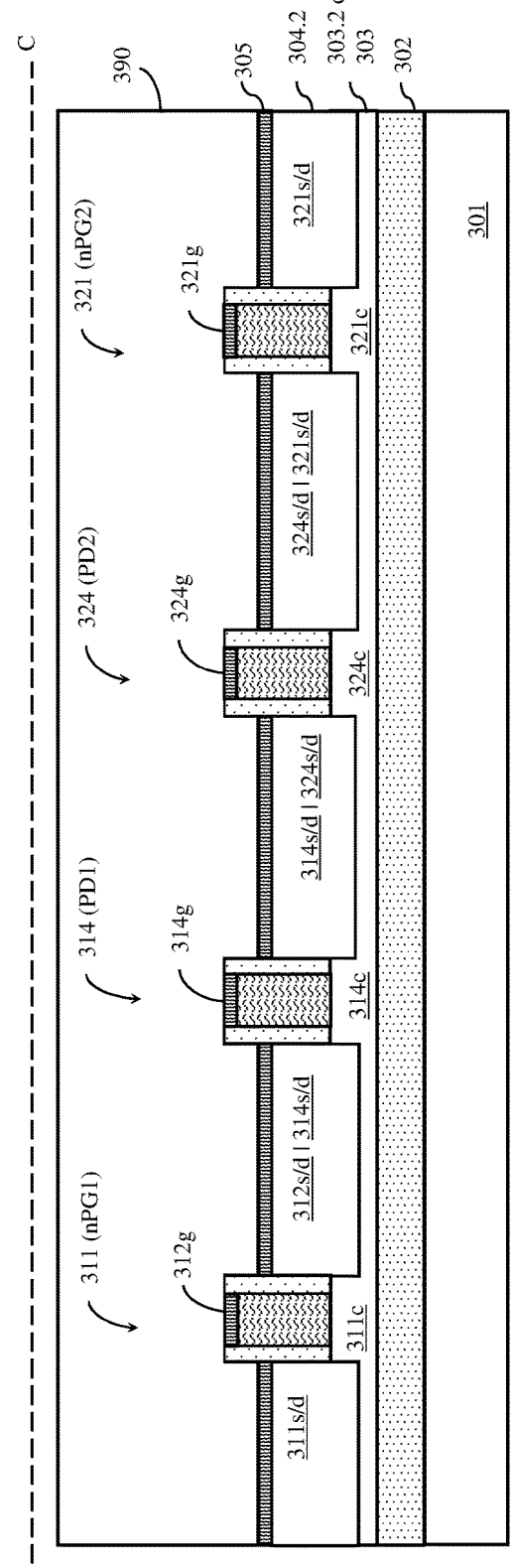
Figure 4D:
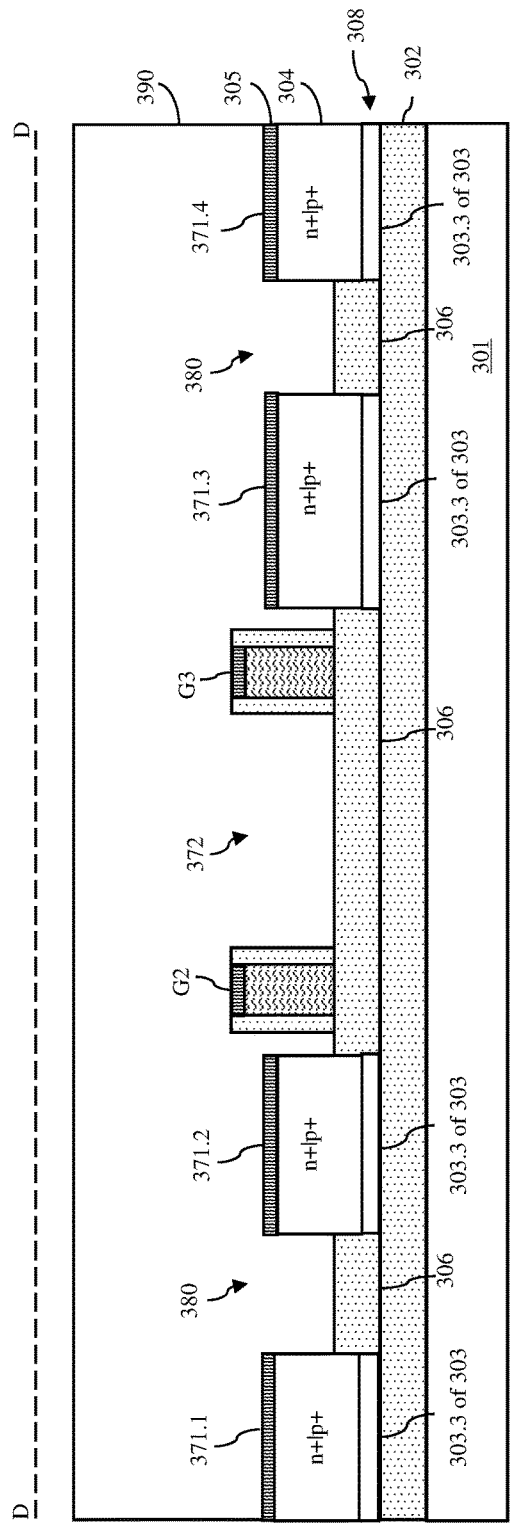
Figure 4E:
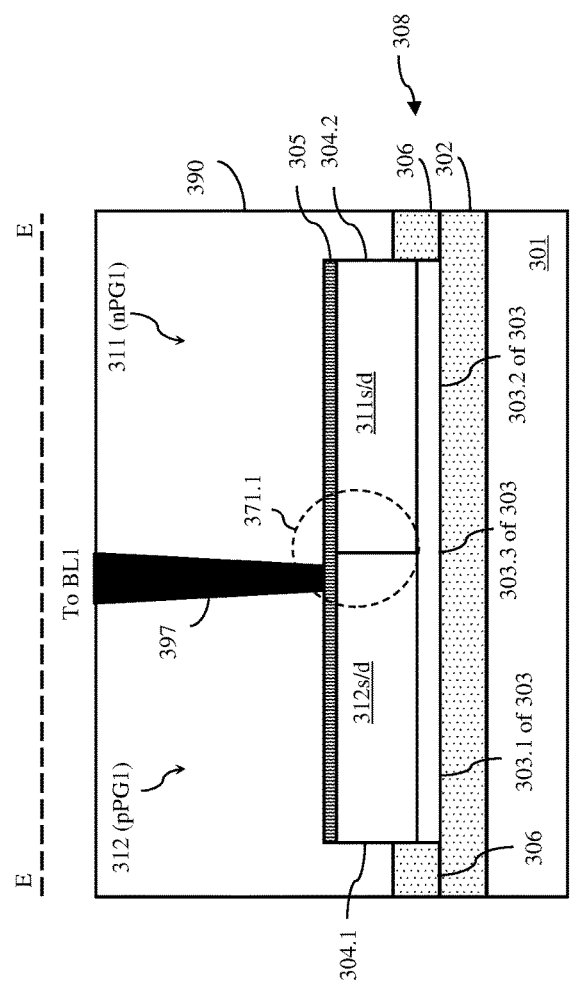

Each 8T SRAM cell 300 can include a first semiconductor body 303.1 and a second semiconductor body 303.2, which is parallel to the first semiconductor body 303.1. The first and second semiconductor bodies 303.1 and 303.2 can be elongated essentially rectangular-shaped semiconductor bodies. In some embodiments, an isolation region 308 between the two semiconductor bodies 303.1 and 303.2 can include a combination of shallow trench isolation (STI) regions 306 and semiconductor extensions 303.3 extending laterally between and perpendicular to adjacent sections of the first and second semiconductor bodies 303.1 and 303.2 (see detailed discussion below and the cross-sections DD of FIG. 4D, EE of FIG. 4E, GG of FIG. 4G, KK of FIG. 4K and MM of FIG. 4M). In other embodiments, the isolation region 308 can be one continuous STI region 306 between and extending the full length of the first semiconductor body 303.1 and the second semiconductor body 303.2 such that it is positioned laterally between all adjacent sections (see alternative cross-section DD of FIG. 4N and alternative cross-sections EE, GG, KK, and MM of FIG. 4O, see also the cross-section shown in FIG. 7).

More specifically, the structure can include shallow trench isolation (STI) regions 306. The STI regions 306 can include trenches, which extends vertically through the semiconductor layer 303 to the insulator layer 302 in the case of a semiconductor-on-insulator structure, as illustrated (or, alternatively, which extends vertically into the upper portion of the semiconductor substrate to a buried well region in the case of a bulk semiconductor structure). In some embodiments, the trenches can be patterned so that the first and second semiconductor bodies 303.1 and 303.2 are elongated essentially rectangular-shaped semiconductor bodies with some adjacent sections of the first and second semiconductor bodies being physically separated by trenches and with other adjacent sections of the semiconductor bodies having semiconductor extensions 303.3 extending laterally therebetween (see FIGS. 4D, 4E, 4G, 4K and 4M and the discussion thereof below). It should be noted that the semiconductor extensions 303.3 can be undoped or, alternatively, different portions of the semiconductor extensions immediately adjacent to the two different semiconductor bodies can be oppositely doped such that the semiconductor extensions do not provide an electrical connection between the two different semiconductor bodies. In other embodiments, the trenches can be patterned so that the first and second semiconductor bodies 303.1 and 303.2 are discrete essentially elongated rectangular-shaped bodies that are completely physically separated by a trench (see FIGS. 4N-4O and FIG. 7 and the discussion thereof below). In any case, the trenches can be filled with isolation material (e.g., silicon dioxide or some other suitable isolation material), thereby forming STI regions 306. Thus, as discussed above, the isolation region 308 between the first semiconductor body 303.1 and the second semiconductor body 303.2 includes a combination of STI regions 306 and semiconductor extensions 303.3 in some embodiments (see detailed discussion below and the cross-sections DD of FIG. 4D, EE of FIG. 4E, GG of FIG. 4G, KK of FIG. 4K and MM of FIG. 4M) and a single continuous STI region 306 in other embodiments (see alternative cross-section DD of FIG. 4N and alternative cross-sections EE, GG, KK, and MM of FIG. 4O, see also the cross-section shown in FIG. 7).

It should be noted that, within each row R0-Rn, first semiconductor bodies 303.1 for adjacent 8T SRAM cells can be in end-to-end alignment and physically separated by an STI region 306 and second semiconductor bodies 303.2 for the adjacent 8T SRAM cells can similarly be in end-to-end alignment and physically separated by an STI region 306. End-to-end alignment of semiconductor bodies refers to the idea that elongated semiconductor bodies arranged (e.g., patterned) in a line with the end of one semiconductor body being adjacent to the end of the next semiconductor body in the line, and so on. As mentioned above, within each 8T SRAM cell, the first and second semiconductor bodies 303.1-303.2 are positioned laterally adjacent to each other and physically separated by STI 306. Additionally, it should be noted that, from row to row, placement of the first and second semiconductor bodies 303.1-303.2 alternates. For example, in the first row (R0), the first semiconductor bodies 303.1 can be above the second semiconductor bodies 303.2 (as oriented on the drawing sheet); in the second row (R1), the second semiconductor bodies 303.2 can be above the first semiconductor bodies 303.1 (as oriented on the drawing sheet) such that they are adjacent to the second semiconductor bodies 303.2 of R0; in the third row (R2), the first semiconductor bodies 303.1 can be above the second semiconductor bodies 303.2 (as oriented on the drawing sheet) such that they are adjacent to the first semiconductor bodies 303.1 of R1; and so on. Thus, in each column, the order of semiconductor bodies would be first semiconductor body, two second semiconductor bodies, two first semiconductor bodies, and so on. For purposes of illustration, the 8T SRAM cell 300 shown in detail FIGS. 4A, 5 and 6 has the first semiconductor body 303.1 above the second semiconductor body 303.2 (as oriented on the drawing sheet).

Each 8T SRAM cell 300 can further include four gate structures (i.e., a first gate structure (G1), a second gate structure (G2), a third gate structure (G3) and a fourth gate structure (G4)). The four gate structures G1-G4 can be parallel, equally spaced, and essentially perpendicular to and overlaying the first and second semiconductor bodies 303.1-303.2. That is, the four gate structures G1-G4 can traverse the first semiconductor body 303.1, the isolation region 308 (and, particularly, STI region(s) 306 in the isolation region 308), and the second semiconductor body 303.2 and can be immediately adjacent to at least the top surface of the first and second semiconductor bodies 303.1-303.2. Gate sidewall spacers can be positioned laterally adjacent to the sidewalls of each of the four gate structures G1-G4.

Each 8T SRAM cell 300 can include eight field effect transistors (FETs) and, specifically, four p-type field effect transistors (pFETs) on the first semiconductor body 303.1 and four n-type field effect transistors (nFETs) on the second semiconductor body 303.2. Each one of the four gate structures can be common to one of the four pFETs and an adjacent one of the four nFETs. That is, the four pFETs can include first sections of the four gate structures, respectively (i.e., those sections immediately adjacent to the first semiconductor body) and the four nFETs can include second sections of the four gate structures, respectively (i.e., those sections immediately adjacent to the second semiconductor body).

For purposes of illustration, these eight FETs are described below and illustrated in the drawings as being planar FETs, where the top surfaces of the STI regions 306 and the semiconductor bodies 303.1 and 303.2 at the FET channel regions are essentially co-planar and where the four gate structures are only adjacent to the top surfaces of the first and second semiconductor bodies 303.1-303.2. However, it should be understood that the salient aspects of the disclosed memory structure embodiments do not rely on the type of FETs used (e.g., planar or non-planar) but rather on the novel layout of the 8T SRAM cell as well as the various interconnects that provide the internal and external electrical connections required to make the 8T SRAM cell operational. Thus, it should be understood that the embodiments described above and illustrated in the drawings are not intended to be limiting. For example, the same 8T SRAM cell layout with two semiconductor bodies and four gate structures for eight FETs could be employed in alternative embodiments where the eight FETs are non-planar FETs (e.g., fin-type FETs (finFETs), gate-all-around FETs (GAAFETs), etc.).

For example, instead of being essentially planar semiconductor bodies with top surfaces co-planar with the top surface of the isolation region (as illustrated), the first and second semiconductor bodies could be first and second semiconductor fins with top surfaces that are above the level of the top surface of the isolation region. In this case, each of the four gate structures can traverse the semiconductor fins and, particularly, be positioned adjacent to the top surface and the opposing sides of each semiconductor fin such that the eight FETs are finFETs. Alternatively, instead of being essentially planar semiconductor bodies with top surfaces co-planar with the top surface of the isolation region (as illustrated), the first and second semiconductor bodies could be first and second nanosheets or nanowires (or first and second stacks of nanosheets or nanowires) that are above the level of the top surface of the isolation region. In this case, each of the four gate structures can traverse the first and second nanosheets or nanowires and, particularly, can wrap around the top surface, bottom surface and opposing sides of the first and second nanosheets or nanowires such that the eight FETs are GAAFETs.

In any case, the four pFETs can include, in order across the first semiconductor body 303.1, a first p-type pass-gate transistor (pPG1) 312, a first p-type pull-up transistor (PU1) 313, a second p-type pull-up transistor (PU2) 323, and a second p-type pass-gate transistor (pPG2) 322. pPG1 312 and PU1 313 can be connected in series between a first bitline (BL1) and a first voltage rail (e.g., a positive supply voltage rail at VDD or, alternatively, at VCS). PU2 323 and pPG2 322 can be connected in series between the first voltage rail 391 and a second bitline (BL2). The four nFETs can include, in order across the second semiconductor body 303.2, a first n-type pass-gate transistor (nPG1) 311, a first n-type pull-down transistor (PD1) 314, a second n-type pull-down transistor (PD2) 324, and a second n-type pass-gate transistor (nPG2) 321. nPG1 311 and PD1 314 can be connected in series between BL1 and a second voltage rail 392 (e.g., a ground or negative voltage rail at VSS). PD2 324 and nPG2 321 can be connected in series between the second voltage rail 392 and BL2. Interconnects that provide the electrical connections to the first voltage rail 391, the second voltage rail 392, BL1 and BL2 are described in greater detail below.

As mentioned above, each one of the four gate structures G1-G4 can be common to one of the four pFETs and to an adjacent one of the four nFETs. Specifically, the first and second sections of the first gate structure G1 can be the gates 312g and 311g of pPG1 312 and nPG1 312, respectively. The first and second sections of the second gate structure G2 can be the gates 313g and 314g of PU1 313 and PD1 314, respectively. The first and second sections of the third gate structure G3 can be the gates 323g and 324g of PU2 323 and PD2 324, respectively. Finally, the first and second sections of the fourth gate structure G4 can be the gates 322g and 321g of pPG2 323 and nPG2 321, respectively.

The first and second sections of each gate structure G1-G4 can include at least a gate dielectric layer and a gate conductor layer on the gate dielectric layer. However, since the first sections and second sections are employed as the gates for pFETs and nFETs, respectively, the gate structures can, optionally, be dual work function gate structure wherein the first and second sections are different (e.g., comprise different materials) for optimal pFET and nFET performance.

More specifically, in some embodiments, each gate structure G1-G4 can include the same materials in the first and second sections including a gate dielectric layer and a gate conductor layer, which is suitable for either pFET or nFET performance.

In some embodiment, each gate structure G1-G4 can include: a gate dielectric layer, such as a silicon dioxide gate dielectric layer, in both the first and second sections; a p-doped polysilicon gate conductor layer in the first section for optimal pFET performance; and an n-doped polysilicon gate conductor layer in the second section for optimal nFET performance.

In still other embodiments, each gate structure G1-G4 can include: a high-K gate dielectric layer in both the first and second sections; one or more work function metal layers in the first section and preselected to achieve an optimal pFET work function; one or more different work function metal layers in the second section and preselected to achieve an optimal nFET work function; and, optionally, conductive fill material on the work function metal layers in both the first section and the second section. Those skilled in the art will recognize that a high-K gate dielectric layer refers to a layer of dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Those skilled in the art will further recognize that the optimal work function for a gate conductor of pFET will be, for example, between about 4.9 eV and about 5.2 eV. Exemplary metals (and metal alloys), which have a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Those skilled in the art will further recognize that the optimal work function for a gate conductor of an nFET will be, for example, between 3.9 eV and about 4.2 eV. Exemplary metals (and metal alloys), which have a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The conductive fill material layer can be, for example, doped poly silicon or any suitable metal or metal alloy fill material including, but not limited to, tungsten, a tungsten alloy (e.g., tungsten silicide or titanium tungsten), cobalt, or aluminum. Various configurations for dual work function gate structures are known in the art and, thus, the details thereof have been omitted from this specification in order to allow the reader to focus on the salient aspects of the disclosed embodiments.

Figures 4F, 4G:
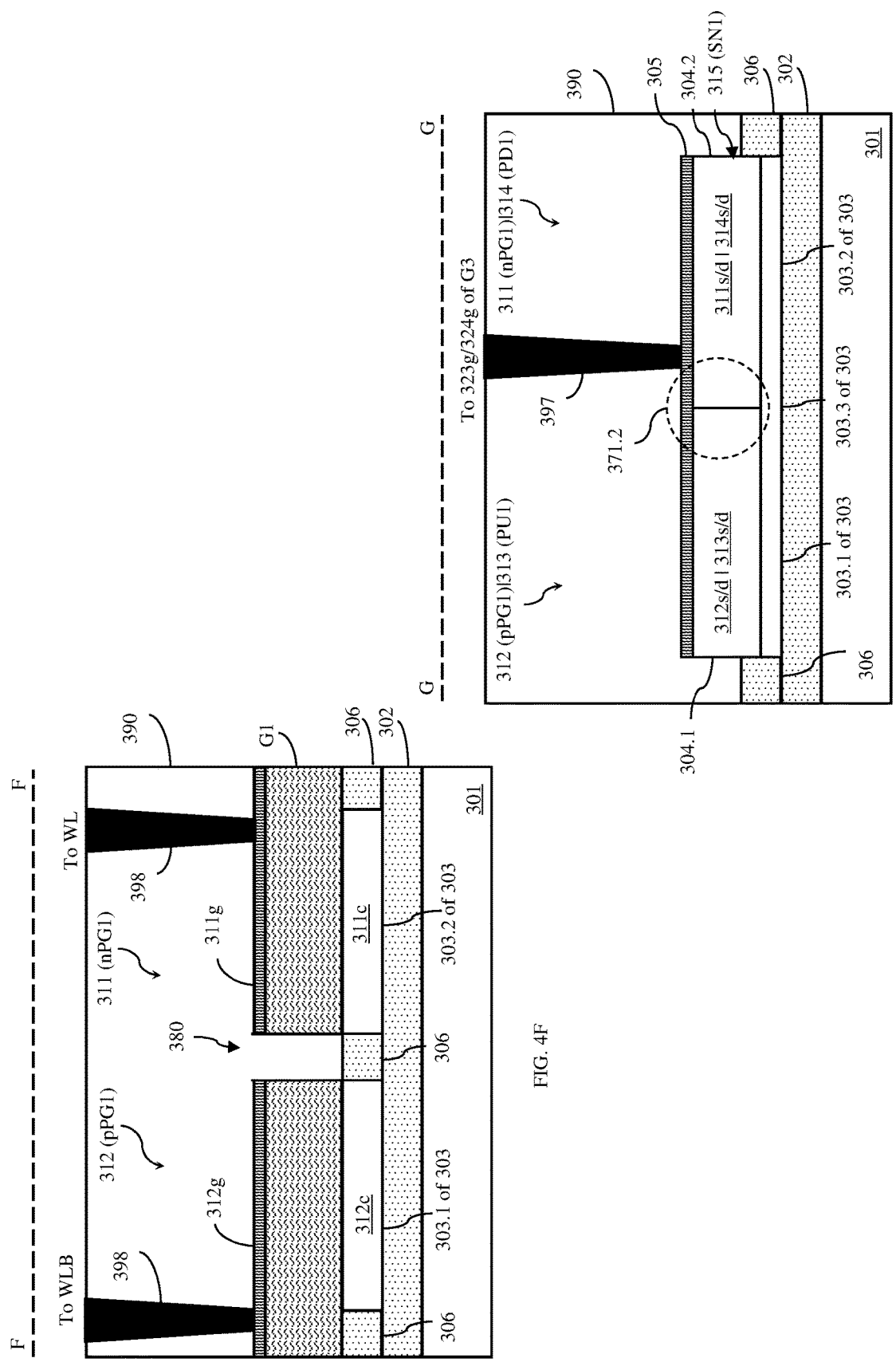

In any case, within the first gate structure G1, which is the common gate structure of pPG1 312 and nPG1 311, a gate cut isolation region 380 can electrically isolate the first section from the second section (i.e., the gate 312g of pPG1 312 from the gate 311g of nPG1 312) (see FIG. 4F). Similarly, within the fourth gate structure G4, which is the common gate structure of pPG2 322 and nPG2 321, another gate cut isolation region 380 can electrically isolate the first section from the second section (i.e., the gate 322g of pPG2 322 from the gate 321g of nPG2 321) (see FIG. 4L).

Those skilled in the art will recognize that a gate cut isolation region refers to an isolation structure that physically separates and electrically isolates the gate conductor material in adjacent sections of a gate structure in order to electrically isolate those sections. Thus, the gates of pPG1 and nPG1 can be electrically connected to and controlled by two different wordlines (WLB and WL, respectively) and the gates of pPG2 and nPG2 can also be electrically connected to and controlled by the two different wordlines (WLB and WL, respectively), where the signals on the different wordlines are inverted with respect to each other. Depending upon the processing techniques used to form the gate structure, the structure of the cut isolation region may vary. For example, each gate cut isolation region 380 could include ILD material that completely fills the spaces between patterned sections of the gate conductor material that are in end-to-end alignment (as illustrated). Alternatively, each gate cut isolation region 380 could include sidewall spacers positioned laterally adjacent to end walls of the patterned sections of the gate conductor material that are in end-to-end alignment and ILD material between the sidewall spacers. Alternatively, each gate cut isolation region 380 can have any other structure suitable for providing isolation between sections of gate conductor material that are in end-to-end alignment. End-to-end alignment of sections of a gate structure refers to the idea that elongated sections of a gate structure are arranged (e.g., patterned) in a line with the end of one section being adjacent to the end of the next section in the line, and so on.

Within the second gate structure G2, which is the common gate structure of PU1 313 and PD1 314, the first and second sections are not electrically isolated from each other by a gate cut isolation region and, thus, the gates 313g and 314g of PU1 313 and PD1 314 are electrically connected (see FIG. 4H). Within the third gate structure G3, which is the common gate structure of PU2 323 and PD2 324, the first and second sections are also not electrically isolated from each other by a gate cut isolation region and, thus, the gates. 323g and 324g of PU2 323 and PD2 324 are also electrically connected (see FIG. 4J).

It should be noted that the same four gate structures (G1-G4) can extend across the first and second semiconductor bodies of each 8T SRAM cell in the same column. Additional gate cut isolation regions 380 can provide gate-to-gate isolation, as needed. For example, within G2 of column (c), the gates 313g and 314g of PU1 313 and PD1 314 of 8T SRAM cell 300 can be electrically isolated by gate cut isolation regions 380 from the gates of a pull-up transistor and a pull-down transistor, respectively, of the 8T SRAM cells $300_{(c:r-1)}$ and $300_{(c:r+1)}$ in the adjacent rows. Similarly, within G3 of column (c), the gates 323g and 324g of PU2 323 and PD2 324 of 8T SRAM cell 300 can be electrically isolated by gate cut isolation regions 380 from the gates of a pull-up transistor and a pull-down transistor, respectively, of the 8T SRAM cells $300_{(c:r-1)}$ and $300_{(c:r+1)}$ in the adjacent rows. However, within G1, the gate 312g of pPG1 is continuous with the gate of a p-type pass-gate transistor of the 8T SRAM cell $300_{(c:r-1)}$ and the gate 311g of nPG1 is continuous with the gate of an n-type pass-gate transistor of the 8T SRAM cell $300_{(c:r+1)}$. Similarly, within G4, the gate 322g of pPG2 is continuous with the gate of a p-type pass-gate transistor of the 8T SRAM cell $300_{(c:r-1)}$ and the gate 321g of nPG2 is continuous with the gate of an n-type pass-gate transistor of the 8T SRAM cell $300_{(c:r+1)}$.

The four pFETs can further include: channel regions in the first semiconductor body 303.1 immediately adjacent to the first sections of the gate structures; and source/drain regions in and/or on the first semiconductor body on opposing sides of the first sections of the gate structures (see FIG. 4B). Specifically, pPG1 312 can include: a channel region 312c, which is within the first semiconductor body 303.1 adjacent to the gate 312g; and source/drain regions 312s/d in and/or on the first semiconductor body 303.1 on opposing sides of the gate 312g. PU1 313 can include: a channel region 313c, which is within the first semiconductor body 303.1 adjacent to the gate 313g; and source/drain regions 313s/d in and/or on the first semiconductor body 303.1 on opposing sides of the gate 313g. PU2 323 can include: a channel region 323c, which is within the first semiconductor body 303.1 adjacent to the gate 323g; and source/drain regions 323s/d in and/or on the first semiconductor body 303.1 on opposing sides of the gate 323g. Finally, pPG2 322 can include: a channel region 322c, which is within the first semiconductor body 303.1 adjacent to the gate 322g; and p-type source/drain regions 322s/d in and/or on the first semiconductor body 303.1 on opposing sides of the gate 322g.

The channel regions 312c, 313c, 323c and 322c of the pFETs can be intrinsic (i.e., undoped) or, alternatively, doped so as to have an n-type conductivity at a relatively low conductively level (e.g., n– conductivity). The source/drain regions 312s/d, 313s/d, 323s/d, and 322s/d of the pFETs can be doped so as to have p-type conductivity at a relatively high conductivity level (e.g., p+ conductivity). Additionally, adjacent pFETs and can have a common p-type source/drain region (also referred to herein as a shared source/drain region) between their respective gates. That is, one of the p-type source/drain regions 312s/d of pPG1 312 can abut one of the p-type source/drain regions 313s/d of PU1 313, thereby forming a common p-type source/drain region of pPG1 312 and PU1 313; one of the p-type source/drain regions 313s/d of PU1 313 can abut one of the p-type source/drain regions 323s/d of PU2 323, thereby forming a common p-type source/drain region of PU1 313 and PU2 323; and one of the p-type source/drain regions 323s/d of PU2 323 can abut one of the p-type source/drain regions 322s/d of pPG2 322, thereby forming a common p-type source/drain region of PU2 323 and pPG2 322.

In some embodiments, the source/drain regions 312s/d, 313s/d, 323s/d, and 322 s/d of the pFETs can include epitaxial semiconductor material on the first semiconductor body 303.1. The epitaxial semiconductor material can be grown on the top surface of the first semiconductor body 303.1 on either side of the first sections of the gate structures G1-G4 and physically separated therefrom by the gate sidewall spacers. Alternatively, the epitaxial semiconductor material can be grown within source/drain trenches that have been etched into the first semiconductor body 303.1 on either side of the first sections of the gate structures G1-G4 and physically separated therefrom by the gate sidewall spacers. In either case, the epitaxial semiconductor material can be the same semiconductor material used in the first semiconductor body (e.g., silicon) or some other suitable semiconductor material or material(s) (e.g., silicon germanium or layers of silicon germanium and silicon). In other embodiments, the source/drain regions 312s/d, 313s/d, 323s/d, and 322s/d of the pFETs could be dopant implant regions within the first semiconductor body 303.1. In any case, as mentioned above, the p-type source-drain regions can be doped so as to have a p-type conductivity at a relatively high conductivity level (e.g., so as to have p+ conductivity).

The four n-FETs can further include: channel regions in the second semiconductor body 303.2 adjacent to the second sections of the gate structures G1-G4; and source/drain regions in and/or on the second semiconductor body 303.1 on opposing sides of the second sections of the gate structures G1-G4 (see FIG. 4C). Specifically, nPG1 311 can include: a channel region 311c, which is within the second semiconductor body 303.2 adjacent to the gate 311g; and source/drain regions 311s/d in and/or on the second semiconductor body 303.2 on opposing sides of the gate 311g. PD1 314 can include: a channel region 314c, which is within the second semiconductor body 303.2 adjacent to the gate 314g; and source/drain regions 314s/d in and/or on the second semiconductor body 303.2 on opposing sides of the gate 314g. PD2 324 can include: a channel region 324c, which is within the second semiconductor body 303.2 adjacent to the gate 324g; and source/drain regions 324s/d in and/or on the second semiconductor body 303.2 on opposing sides of the gate 324g. Finally, nPG2 321 can include: a channel region 321c, which is within the second semiconductor body 303.2 adjacent to the gate 321g; and source/drain regions 321s/d in and/or on the second semiconductor body 303.2 on opposing sides of the gate 321g.

The channel regions 311c, 314c, 324c and 322c of the nFETs can be intrinsic (i.e., undoped) or, alternatively, doped so as to have a p-type conductivity at a relatively low conductively level (e.g., p− conductivity). The source/drain regions 311s/d, 314s/d, 324s/d, and 321s/d of the nFETs can be doped so as to have n-type conductivity at a relatively high conductivity level (e.g., n+ conductivity). Additionally, adjacent nFETs can have a common n-type source/drain region (also referred to herein as a shared source/drain region) between their respective gates. That is, one of the n-type source/drain regions 311s/d of nPG1 311 can abut one of the n-type source/drain regions 314s/d of PD1 314, thereby forming a common n-type source/drain region of nPG1 311 and PD1 314; one of the n-type source/drain regions 314s/d of PD1 314 can abut one of the n-type source/drain regions 324s/d of PD2 324, thereby forming a common n-type source/drain region of PU1 314 and PU2 324; and one n-type source/drain regions 324s/d of PD2 324 can abut one of the n-type source/drain regions 321s/d of nPG2 321, thereby forming a common p-type source/drain region of PD2 324 and nPG2 321.

In some embodiments, the source/drain regions 311s/d, 314s/d, 324s/d, and 321s/d of the nFETs can include epitaxial semiconductor material on the second semiconductor body 303.2. The epitaxial semiconductor material can be grown on the top surface of the second semiconductor body 303.2 on either side of the second sections of the gate structures G1-G4 and physically separated therefrom by the gate sidewall spacers. Alternatively, the epitaxial semiconductor material can be grown within source/drain trenches that have been etched into the second semiconductor body 303.2 on either side of the second sections of the gate structures G1-G4 and physically separated therefrom by the gate sidewall spacers. In either case, the epitaxial semiconductor material can be the same semiconductor material used in the second semiconductor body (e.g., silicon) or some other suitable semiconductor material or material(s) In other embodiments, the source/drain regions 311s/d, 314s/d, 324s/d, and 321s/d of the nFETs could be dopant implant regions within the second semiconductor body 303.2. In any case, as mentioned above, the n-type source-drain regions can be doped so as to have an n-type conductivity at a relatively high conductivity level (e.g., so as to have n+ conductivity).

Various interconnects, discussed below, can provide external and internal electrical connections to and between the FETs within the 8T SRAM cell in order to make each 8T SRAM cell operational and further between FETs of adjacent 8T SRAM cells within the columns in order to efficiently incorporate the cells into an array.

Specifically, each 8T SRAM cell 300 can include the following internal electrical connections. The common p-type source/drain region of PU1 313 and PU2 323 (see abutting p-type source/drain regions 313s/d and 323s/d) can be electrically connected to the first voltage rail 391 (e.g., at VDD or VCS). Additionally, the common n-type source/drain region of PD1 314 and PD2 324 (see abutting n-type source/drain regions 314s/d and 324s/d between the gates 314g and 324g) can be electrically connected to the second voltage rail 392 (e.g., at VSS).

The common p-type source/drain region of pPG1 312 and PU1 313 (see abutting p-type source/drain regions 312s/d and 313s/d between the gates 312g and 313g) and the common n-type source/drain region of nPG1 311 and the PD1 314 (see abutting n-type source/drain regions 311s/d and 314s/d between the gates 311g and 314g) can be electrically connected to each other to form a first storage node (SN1) 315 for the 8T SRAM cell 300 and SN1 315 can be electrically connected to the third gate structure G3, which is the common gate structure of the PU2 323 and PD2 324 (i.e., to gates 323g and 324g). Similarly, the common p-type source/drain region of pPG2 322 and PU2 323 (see abutting p-type source/drain regions 322s/d and 323s/d between the gates 322g and 323g) and the common n-type source/drain region of nPG2 321 and the PD2 324 (see abutting n-type source/drain regions 321s/d and 324s/d between the gates 321g and 324g) can be electrically connected to each other to form a second storage node (SN2) 325 for the 8T SRAM cell 300 and SN2 325 can be electrically connected to the second gate structure G2, which is the common gate structure of PU1 313 and the PD1 314 (i.e., to gates 313g and 314g).

Additionally, the p-type source/drain region 312s/d of pPG1 312 at one end of the first semiconductor body 303.1 can be electrically connected to the adjacent n-type source/drain region 311s/d of nPG1 311 at the same end and further electrically connected to BL1. Similarly, the p-type source/drain region 322s/d of pPG2 322 at the opposite end of the first semiconductor body 303.1 can be electrically connected to the adjacent n-type source/drain region 321s/d of nPG2 321 at the same end and further electrically connected to BL2. Thus, as mentioned above, pPG1 312 and PU1 313 are electrically connected in series between BL1 and the first voltage rail 391, PU2 323 and pPG2 322 are electrically connected in series between the first voltage rail 391 and BL2, nPG1 311 and PD1 314 are electrically connected in series between BL1 and the second voltage rail 392, and PD2 324 and nPG2 321 are electrically connected in series between the second voltage rail 392 and BL2. As a result, pPG1 312 and nPG1 311 are also electrically connected in parallel between BL1 and SN1 315 and since the gates of pPG1 and nPG1 are controlled by two different wordline signals on WLB and WL, respectively, that are inverted with respect each other, pPG1 311 and nPG1 312 form a first transmission gate (TG1) that provides access to SN1 315. Similarly, pPG2 322 and nPG2 321 are electrically connected in parallel between BL2 and SN2 325 and since the gates of pPG2 322 and nPG2 321 are also controlled by the same wordline signals on WLB and WL, respectively, pPG2 322 and nPG2 321 form a second transmission gate (TG2) that provides access to SN2 325. Such transmission gates TG1 and TG2 reduce leakage current and delay and improve data stability.

Each 8T SRAM cell 300 can further include the following external electrical connections to adjacent 8T SRAM cell(s) (e.g., to 8T SRAM cells $300_{(c:r-1)}$ and/or $300_{(c:r+1)}$ in the adjacent row(s) of the same column. The common p-type source/drain region of PU1 313 and PU2 323 (see abutting p-type source/drain regions 313s/d and 323s/d) of the 8T SRAM cell 300 can be electrically connected to the common p-type source/drain region of the pull-up transistors of an adjacent 8T SRAM cell (e.g., see adjacent 8T SRAM cell $300_{(c:r-1)}$), which is also connected to the first voltage rail 391. Additionally, the common n-type source/drain region of PD1 314 and PD2 324 (see abutting n-type source/drain regions 314*s/d* and 324*s/d*) of the 8T SRAM cell 300 can be electrically connected to the common n-type source/drain region of the pull-down transistors of an adjacent 8T SRAM cell (e.g., see adjacent 8T SRAM cell 300$_{(c:r+1)}$), which is also connected to the second voltage rail 392. It should be understood that 8T SRAM cells that are in rows between the first row (R0) and the last row (Rn) will be connected to two adjacent 8T SRAM cells, as described. However, 8T SRAM cells in the first row (R0) and the last row (Rn) will only be connected to one adjacent 8T SRAM cell.

The embodiments of the memory structure (e.g., see memory structure 400 of FIGS. 4A-4M, 500 of FIG. 5, and 600 of FIG. 6), vary with respect to how the above-described internal and external electrical connections are achieved. Specifically, they vary with respect to the different types of interconnects employed and, particularly, with respect to the different combinations of silicide bridges and/or contact straps, conventional middle of the line (MOL) contacts, and back end of the line (BEOL) wiring employed.

Referring specifically to FIGS. 4A and 4B-4M (or, alternatively, 4N-4O), in some embodiments, silicide bridges can make any required electrical connections between adjacent p-type and n-type source/drain regions. Specifically, a first silicide bridge 371.1 can electrically connect the p-type source/drain region 312*s/d* of pPG1 312 to the adjacent n-type source/drain region 311*s/d* of nPG1 311 at one end of the semiconductor bodies 303.1-303.2. In this case, a conventional MOL source/drain contact 397 can extend through the dielectric material 390 and make the electrical connection to BL1 (e.g., in the BEOL metal levels, not shown). A second silicide bridge 371.2 can electrically connect the common p-type source/drain region of pPG1 312 and PU1 313 between gates 312*g* and 313*g* to the adjacent common n-type source/drain region of nPG1 311 and PD1 314 between gates 311*g* and 314*g* to the form SN1 315. In this case, a conventional MOL source/drain contact 397 can extend through the dielectric material 390 landing on SN1 315, a conventional MOL gate contact 398 can extend through the dielectric material landing on the third gate structure G3, and BEOL metal wiring (not shown) can connect these contacts, thereby electrically connecting SN1 to gates 323*g* of PU2 323 and 324*g* of PD2 324. A third silicide bridge 371.3 can electrically connect the common p-type source/drain region of PU2 323 and pPG2 322 between gates 323*g* and 322*g* to the adjacent common n-type source/drain region of PD2 324 and nPG2 321 between gates 324*g* and 321*g* to form SN2 325. In this case, a conventional MOL source/drain contact 397 can extend through the dielectric material 390 landing on SN2 325, a conventional MOL gate contact 398 can extend through the dielectric material 390 landing on the second gate structure G2, and these contacts can be electrically connected by BEOL metal wiring (not shown), thereby electrically connecting SN2 to gates 313*g* of PU1 313 and 314*g* of PD1 314. A fourth silicide bridge 371.4 can electrically connect the p-type source/drain region 322*s/d* of pPG2 312 to the adjacent n-type source/drain region 321*s/d* of nPG1 321 at another end of the semiconductor bodies 303.1-303.2. In this case, a conventional MOL source/drain contact 397 can extend through the dielectric material 390 and make the electrical connection to BL2 (e.g., in the BEOL metal levels, not shown).

Additional silicide bridge(s) 371.5-371.6 can provide the electrical connections to adjacent 8T SRAM cells within the same column, as necessary. For example, as mentioned above, the common p-type source/drain region of PU1 313 and PU2 323 (see abutting p-type source/drain regions 313*s/d* and 323*s/d*) of the 8T SRAM cell 300 can be electrically connected to the common p-type source/drain region of the pull-up transistors of an adjacent 8T SRAM cell (e.g., see adjacent 8T SRAM cell 300$_{(c:r-1)}$) by a fifth silicide bridge 371.5. It should be noted that a single contact 397 landing on the common p-type source/drain region of PU1 313 and PU2 323 of the 8T SRAM cell 300 (as illustrated), on the fifth silicide bridge 371.5, or on the common p-type source/drain region of the pull-up transistors of the adjacent 8T SRAM cell could be employed to provide the connection to the first voltage rail. Furthermore, the common n-type source/drain region of PD1 314 and PD2 324 (see abutting n-type source/drain regions 314*s/d* and 324*s/d*) of the 8T SRAM cell 300 can be electrically connected to the common n-type source/drain region of the pull-down transistors of an adjacent 8T SRAM cell (e.g., see adjacent 8T SRAM cell 300$_{(c:r+1)}$) by a sixth silicide bridge 371.6. It should be noted that a single contact 397 landing on the common n-type source/drain region of PD1 314 and PD2 324 of the 8T SRAM cell 300 (as illustrated), on the sixth silicide bridge 371.6, or on the common n-type source/drain region of the pull-down transistors of the adjacent 8T SRAM cell could be employed to provide the connection to the second voltage rail.

For purposes of this disclosure, a silicide bridge refers to a portion of a silicide layer 305, which is immediately adjacent to a pn junction and, thereby electrically connects the semiconductor material on both sides of the junction. In the 8T SRAM cell, each pair of adjacent p-type and n-type source/drain regions can include p-type epitaxial semiconductor material 304.1 on a section of the first semiconductor body 303.1 and n-type epitaxial semiconductor material 304.2 on an adjacent section of the second semiconductor body 303.2.

Figure 4K:
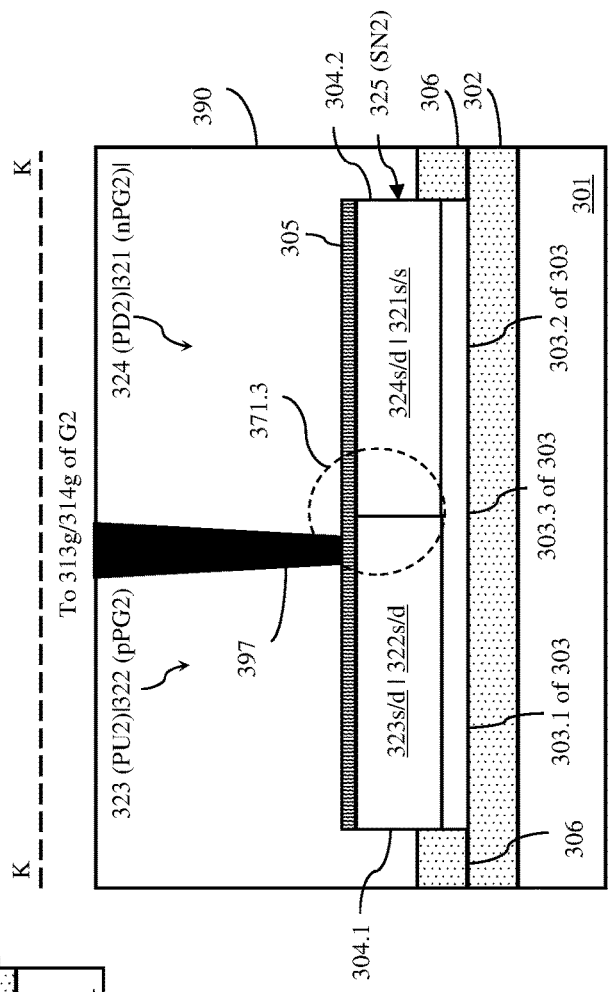
Figure 4J:
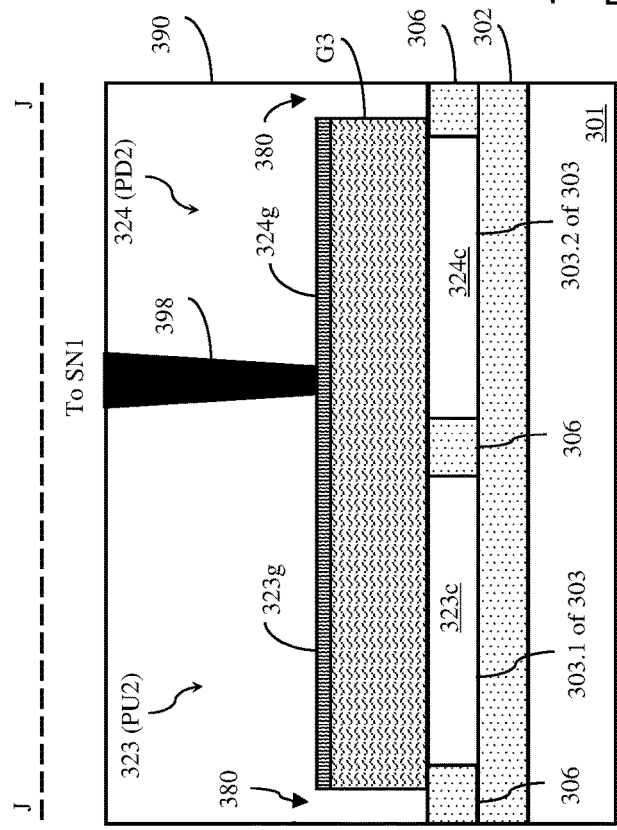
Figure 4N:
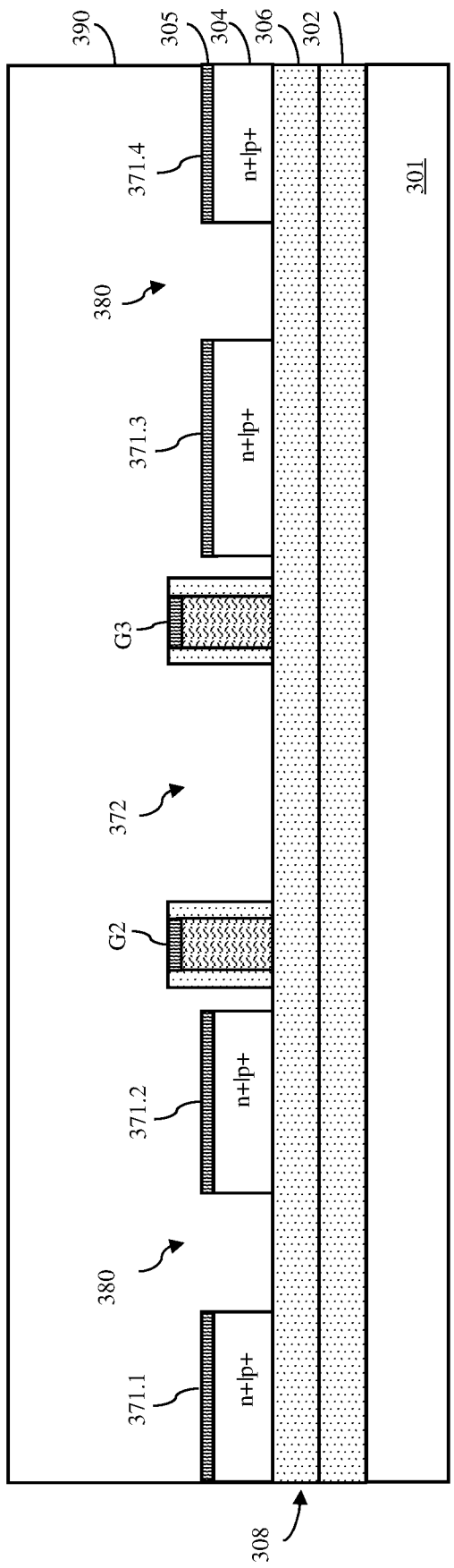
Figure 4O:
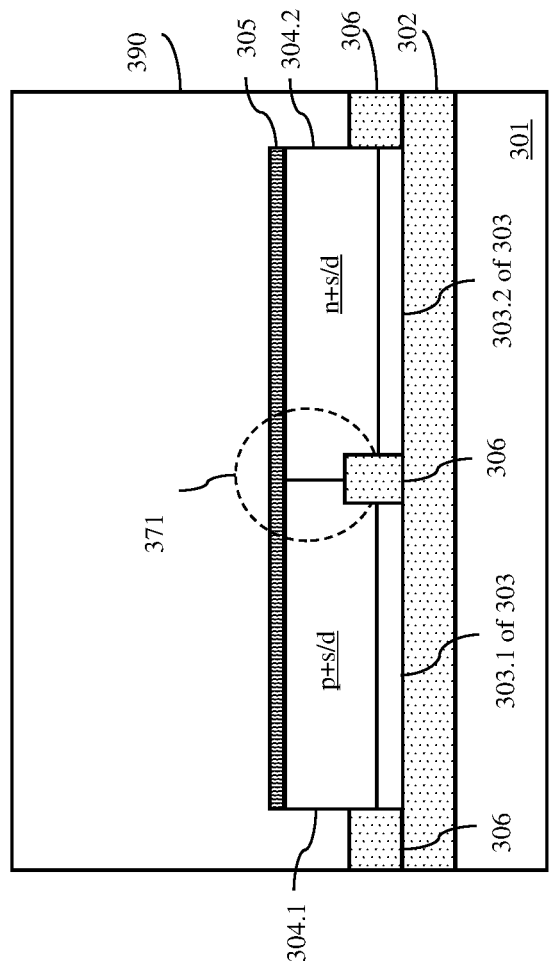
FIG. 4O illustrates an alternative structure for the cross-section diagram DD of the 8T SRAM cell of FIG. 4A

In some embodiments, for any pair of adjacent p-type and n-type source/drain regions that are required to be electrically connected, semiconductor extensions 303.3 can be perpendicular to and extend between the adjacent sections of the first semiconductor bodies 303.1 and 303.2 below (see the cross-sections DD of FIG. 4D, EE of FIG. 4E, GG of FIG. 4G, KK of FIG. 4K, and MM of FIG. 4M). In these embodiments, the p-type and n-type epitaxial semiconductor materials for the source/drain regions can be grown during processing on the first and second semiconductor bodies 303.1 and 303.2, respectively, as well as on the adjacent portions of the semiconductor extensions 303.3, thereby creating a pn junction above each semiconductor extension 303.3.

In other embodiments, however, the isolation region 308 includes an STI region 306 that completely separates the first and second semiconductor bodies 303.1 and 303.2. That is, the structure may be devoid of semiconductor extensions between the semiconductor bodies. In these embodiments, for any pair of adjacent p-type and n-type source/drain regions that are required to be electrically connected, the p-type and n-type epitaxial semiconductor materials for the source/drain regions can be grown during processing on the first and second semiconductor bodies 303.1 and 303.2, respectively, and further overgrown so that they extend onto the adjacent STI region 306 and meet, thereby creating the required p-n junctions (see the alternative cross-section DD shown in FIG. 4N and the alternative cross-sections EE, GG, KK and MM shown in FIG. 4O prior to any contact formation). This can be achieved as long as the gap between the first semiconductor body 303.1 and the second semiconductor body 303.2 are sufficiently narrow.

In either case, when silicide layers 305 are subsequently formed on the top surfaces of all p-type and n-type source/drain regions including over any pn junctions the silicide bridges 371.1-371.6 are formed. It should be noted that, as mentioned above, the common p-type source/drain region of PU1 and PU2 is not to be electrically connected to the adjacent common n-type source/drain region of PD1 and PD2. Thus, during processing, masking layers prevent overgrowth of the epitaxial semiconductor material onto STI region(s) 306 between these source/drain regions and thereby prevent the formation of a pn junction. As a result, when the silicide layers 305 are formed, the silicide layer on the common p-type source/drain region of PU1 and PU2 is physically separated from the silicide layer on the adjacent common n-type source/drain region of PD1 and PD2 and no silicide bridge is formed (see space 372 filled with dielectric material 390 shown in FIGS. 4D and 4I). The silicide layers 305 (including any silicide bridges) are covered by the dielectric material 390.

Referring specifically to FIG. 5, in some embodiments, the isolation region 308 can be an STI region 306 that complete physically separates two discrete semiconductor bodies 303.1 and 303.2 and contact straps 396.1-396.4 can extend laterally across the STI region 306 to make any required electrical connections between adjacent p-type and n-type source/drain regions. Specifically, a first contact strap 396.1 can extend vertically through the dielectric material 390 and electrically connect the p-type source/drain region 312s/d of pPG1 312 and the adjacent n-type source/drain region 311s/d of nPG1 311 at one end of the semiconductor bodies 303.1 and 303.2. This first contact strap 396.1 can further make the electrical connection to BL1 (e.g., in the BEOL metal levels, not shown). A second contact strap 396.2 can extend vertically through the dielectric material 390 and can electrically connect the common p-type source/drain region of pPG1 312 and PU1 313 between gates 312g and 313g to the adjacent common n-type source/drain region of nPG1 311 and PD1 314 between gates 311g and 314g in order to form the SN1 315. In this case, a conventional MOL gate contact 398 extending through the dielectric material 390 and landing on the third gate structure G3 can be electrically connected by BEOL metal wiring (not shown) to the second contact strap 396.2, thereby electrically connecting SN1 to gates 323g of PU2 323 and 324g of PD2 324. A third contact strap 396.3 can extend vertically through the dielectric material 390 and can electrically connect the common p-type source/drain region of PU2 323 and pPG2 322 between gates 323g and 322g to the adjacent common n-type source/drain region of PD2 324 and nPG2 321 between gates 324g and 321g in order to form the SN2 325. In this case, a conventional MOL gate contact 398 extending through the dielectric material 390 and landing on the second gate structure G2 can be electrically connected by BEOL metal wiring (not shown) to third contact strap 396.3, thereby electrically connecting SN2 to gates 313g of PU1 313 and 314g of PD1 314. A fourth contact strap 396.4 can extend vertically through the dielectric material 390 and electrically connect the p-type source/drain region 322s/d of pPG2 312 to the adjacent n-type source/drain region 321s/d of nPG1 321 at another end of the semiconductor bodies 303.1-303.2. This fourth contact strap 396.4 can further make the electrical connection to BL2 (e.g., in the BEOL metal levels, not shown). Since the common p-type source/drain region of PU1 and PU2 is not to be electrically connected to the adjacent common n-type source/drain region of PD1 and PD2, no contact strap extends between these regions.

Additional contact strap(s) 396.5-396.6 can provide the electrical connections to adjacent 8T SRAM cells within the same column, as necessary. For example, as mentioned above, the common p-type source/drain region of PU1 313 and PU2 323 (see abutting p-type source/drain regions 313s/d and 323s/d) of the 8T SRAM cell 300 can be electrically connected to the common p-type source/drain region of the pull-up transistors of an adjacent 8T SRAM cell (e.g., see adjacent 8T SRAM cell $300_{(c:r-1)}$) by a fifth contact strap 396.5. Furthermore, the common n-type source/drain region of PD1 314 and PD2 324 (see abutting n-type source/drain regions 314s/d and 324s/d) of the 8T SRAM cell 300 can be electrically connected to the common n-type source/drain region of the pull-down transistors of an adjacent 8T SRAM cell (e.g., see adjacent 8T SRAM cell $300_{(c:r+1)}$) by a sixth contact stray 396.6.

Figure 7:
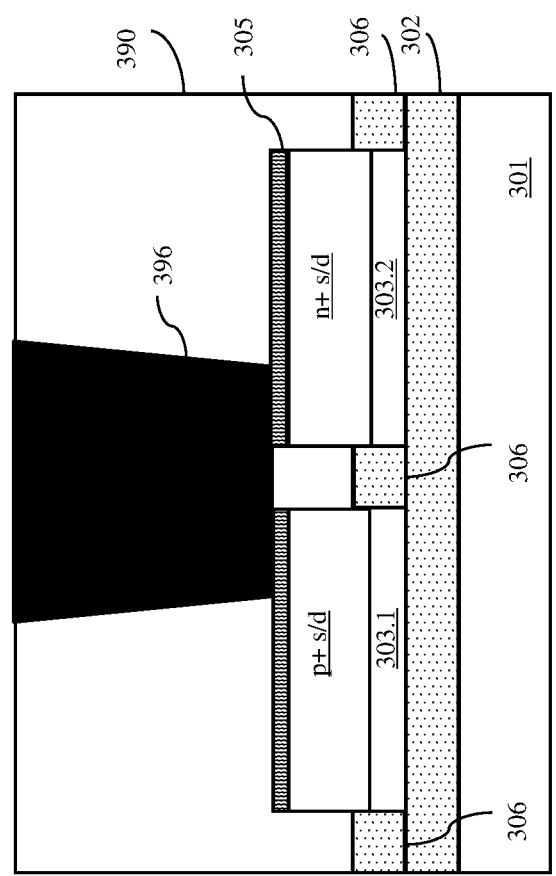
FIG. 7 is a cross-section diagram illustrating an exemplary section of 8T SRAM cell shown in FIG. 5 or FIG. 6 wherein a contract strap is employed to connect adjacent p-type and n-type source/drain regions.

For purposes of this disclosure, a contact strap (also referred to herein as a contact bar) is a middle of the line (MOL) source/drain contact. However, instead of being a conventional MOL source/drain contact with a circular or square shape having a width that is essentially equal to its length (or depth), a contact strap 396 is elongated with a length that is greater than its width so that it can land across multiple source/drain regions (e.g., on a p-type source/drain region, on the isolation region, and on an adjacent n-type source/drain region, as shown in FIG. 7). Thus, the fifth contact strap 396.5 is a shared MOL contact that electrically connects 8T SRAM cells 300 and $300_{(c:r-1)}$ to the first voltage rail 391, whereas the sixth contact strap 396.6 is a shared MOL contact that electrically connects 8T SRAM cells 300 and $300_{(c:r+1)}$ to the second voltage rail 392.

Referring specifically to FIG. 6, in some embodiments, a combination of silicide bridges and contact straps can be employed to make the necessary electrical connections between p-type and n-type source/drain regions. Specifically, some of these electrical connections can be made by contract straps that extend across STI 306 in the isolation region 308 between some adjacent sections of the two semiconductor bodies 303.1 and 303.3, while others of these electrical connections can be made by silicide bridges that are on pn junctions above semiconductor extensions 303.3 or STI 306 in the isolation region 308. For example, a contact strap 396.1 can electrically connect the p-type source/drain region 312s/d of pPG1 312 to the adjacent n-type source/drain region 311s/d of nPG1 311 at one end of the semiconductor bodies and can further make the electrical connection to BL1 (e.g., in the BEOL metal levels, not shown). Another contact strap 396.4 can electrically connect the p-type source/drain region 322s/d of pPG2 312 and the adjacent n-type source/drain region 321s/d of nPG1 321 at the opposite ends of the semiconductor bodies and can further make the electrical connection to BL2 (e.g., in the BEOL metal levels, not shown). Additionally, a silicide bridge 371.2 can electrically connect the common p-type source/drain region of pPG1 312 and PU1 313 between gates 312g and 313g to the adjacent common n-type source/drain region of nPG1 311 and PD1 314 between gates 311g and 314g to the form SN1 315. In this case, a conventional MOL source/drain contact 397 landing on SN1 315 and a conventional MOL gate contact 398 landing on the third gate structure G3 can be electrically connected by BEOL metal wiring (not shown), thereby electrically connecting SN1 to gates 323g of PU2 323 and 324g of PD2 324. Another silicide bridge 371.3 can electrically connect the common p-type source/drain region of PU2 323 and pPG2 322 between gates 323g and 322g to the adjacent common n-type source/drain region of PD2 324 and nPG2 321 between gates 324g and 321g to form SN2 325. In this case, a conventional MOL source/drain contact 397 landing on SN2 325 and a conventional MOL gate contact 398 landing on the second gate structure G2 can be electrically connected by BEOL metal wiring (not shown), thereby electrically connecting SN2 to gates 313g of PU1 313 and 314g of PD1 314.

As in the memory structure 400, in the memory structure 600 additional silicide bridge(s) 371.5-371.6 can provide the electrical connections to adjacent 8T SRAM cells within the same column, as necessary. For example, as mentioned above, the common p-type source/drain region of PU1 313 and PU2 323 (see abutting p-type source/drain regions 313s/d and 323s/d) of the 8T SRAM cell 300 can be electrically connected to the common p-type source/drain region of the pull-up transistors of an adjacent 8T SRAM cell (e.g., see adjacent 8T SRAM cell $300_{(c:r-1)}$) by a fifth silicide bridge 371.5. It should be noted that a single contact 397 landing on the common p-type source/drain region of PU1 313 and PU2 323 of the 8T SRAM cell 300 (as illustrated), on the fifth silicide bridge 371.5, or on the common p-type source/drain region of the pull-up transistors of the adjacent 8T SRAM cell could be employed to provide the connection to the first voltage rail. Furthermore, the common n-type source/drain region of PD1 314 and PD2 324 (see abutting n-type source/drain regions 314s/d and 324s/d) of the 8T SRAM cell 300 can be electrically connected to the common n-type source/drain region of the pull-down transistors of an adjacent 8T SRAM cell (e.g., see adjacent 8T SRAM cell $300_{(c:r+1)}$) by a sixth silicide bridge 371.6. It should be noted that a single contact 397 landing on the common n-type source/drain region of PD1 314 and PD2 324 of the 8T SRAM cell 300 (as illustrated), on the sixth silicide bridge 371.6, or on the common n-type source/drain region of the pull-down transistors of the adjacent 8T SRAM cell could be employed to provide the connection to the second voltage rail.

It should be understood that in the embodiments described above a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a memory structure including a memory cell and, particularly, an eight-transistor (8T) static random access memory (SRAM) cell with high device density and symmetry. The layout of the 8T SRAM cell in particular avoids a significant increase in area consumption over a conventional 6T SRAM cell despite the added transistors for transmission gates. Specifically, in the 8T SRAM cell, two elongated and parallel semiconductor bodies can be separated by an isolation region. Four gate structures can traverse the semiconductor bodies and the isolation region between them. Four p-type transistors (pFETs), including two p-type pass-gate transistors and two pull-up transistors between the two p-type pass-gate transistors, can be on one semiconductor body. Four n-type transistors (nFETs), including two n-type pass-gate transistors and two pull-down transistors between the two n-type pass-gate transistors, can be on the other semiconductor body. Each pair of adjacent p-type and n-type transistors can share a corresponding one of the gate structures (i.e., can have a common gate structure). Various interconnects (including, but not limited to, silicide bridges and/or contact straps) provide the required internal and external electrical connections for making the 8T SRAM cell operational. While a conventional 6T SRAM cell requires two gate structures and the disclosed 8T SRAM cell requires four gate structures, the conventional 6T SRAM cell requires four semiconductor bodies and the disclosed 8T SRAM cell only requires two. Thus, the device density within the memory cell is increased and the difference, if any, in area consumption is minimal. Furthermore, the high degree of symmetry within the cell layout simplifies future size scaling.

What is claimed is:
1. A structure comprising
a substrate; and
a memory cell on the substrate and comprising:
  a first semiconductor body;
  a second semiconductor body adjacent and parallel to the first semiconductor body;
  four gate structures traversing the first semiconductor body and the second semiconductor body;
  four p-type transistors on the first semiconductor body; and
  four n-type transistors on the second semiconductor body, wherein each one of the four gate structures is common to one of the p-type transistors and an adjacent one of the n-type transistors.
2. The structure of claim 1,
wherein the four p-type transistors comprise: a first p-type pass-gate transistor and a first p-type pull-up transistor connected in series between a first bitline and a first voltage rail; and a second p-type pull-up transistor and a second p-type pass-gate transistor connected in series between the first voltage rail and a second bitline, and
wherein the four n-type transistors comprise: a first n-type pass-gate transistor and a first n-type pull-down transistor connected in series between the first bitline and a second voltage rail; and a second n-type pull-down transistor and a second n-type pass-gate transistor connected in series between the second voltage rail and the second bitline.
3. The structure of claim 2,
wherein a common p-type source/drain region of the first p-type pass-gate transistor and the first p-type pull-up transistor and a common n-type source/drain region of the first n-type pass-gate transistor and the first n-type pull-down transistor are electrically connected to form a first storage node,
wherein the first storage node is further electrically connected to a common gate structure of the second p-type pull-up transistor and the second n-type pull-down transistor,
wherein a common p-type source/drain region of the second p-type pass-gate transistor and the second p-type pull-up transistor and a common n-type source/drain region of the second n-type pass-gate transistor and the second n-type pull-down transistor are electrically connected to form a second storage node, and
wherein the second storage node is further electrically connected to a common gate structure of the first p-type pull-up transistor and the first n-type pull-down transistor.
4. The structure of claim 2,
wherein a p-type source/drain region of the first p-type pass-gate transistor is electrically connected to an n-type source/drain region of the first n-type pass-gate transistor and further to the first bitline, and
wherein a p-type source/drain region of the second p-type pass-gate transistor is electrically connected to an n-type source/drain region of the second n-type pass-gate transistor and further to the second bitline, and
wherein a common p-type source/drain region of the first p-type pull-up transistor and the second p-type pull-up transistor is electrically isolated from a common n-type source/drain region of the first n-type pull-down transistor and the second n-type pull-down transistor.
5. The structure of claim 2, further comprising gate cut isolation regions electrically isolating first and second sections of a common gate structure of the first p-type pass-gate transistor and the first n-type pass-gate transistor and further electrically isolating first and second sections of a common gate structure of the second p-type pass-gate transistor and the second n-type pass-gate transistor.
6. The structure of claim 2,
wherein the memory cell is one memory cell in a given row and a given column of an array of memory cells arranged in columns and rows on the substrate,
wherein, in each row, first semiconductor bodies of the memory cells are in end-to-end alignment and second semiconductor bodies of the memory cells are adjacent and parallel to the first semiconductor bodies and in end-to-end alignment, and
wherein, in each column, any two adjacent memory cells are symmetrically oriented and electrically connected at one of adjacent common p-type source/drain regions of first and second pull-up transistors and adjacent common n-type source/drain regions of first and second n-type pull-down transistors.
7. A structure comprising
a substrate; and
a memory cell on the substrate and comprising:
  a first semiconductor body;
  a second semiconductor body adjacent and parallel to the first semiconductor body;
  four gate structures traversing the first semiconductor body and the second semiconductor body;
  four p-type transistors on the first semiconductor body, wherein the four p-type transistors comprise: a first p-type pass-gate transistor; a first p-type pull-up transistor; a second p-type pull-up transistor; and a second p-type pass-gate transistor; and
  four n-type transistors on the second semiconductor body, wherein the four n-type transistors comprise: a first n-type pass-gate transistor; a first n-type pull-down transistor; a second n-type pull-down transistor; and a second n-type pass-gate transistor, and wherein each one of the four gate structures is common to one of the p-type transistors and an adjacent one of the n-type transistors.

8. The structure of claim 7,
wherein the first p-type pass-gate transistor and the first p-type pull-up transistor are connected in series between a first bitline and a first voltage rail,
wherein the second p-type pull-up transistor and the second p-type pass-gate transistor are connected in series between the first voltage rail and a second bitline,
wherein the first n-type pass-gate transistor and the first n-type pull-down transistor are connected in series between the first bitline and a second voltage rail,
wherein the second n-type pull-down transistor and a second n-type pass-gate transistor are connected in series between the second voltage rail and the second bitline,
wherein a common p-type source/drain region of the first p-type pass-gate transistor and the first p-type pull-up transistor and a common n-type source/drain region of the first n-type pass-gate transistor and the first n-type pull-down transistor are electrically connected to form a first storage node,
wherein the first storage node is further electrically connected to a common gate structure of the second p-type pull-up transistor and the second n-type pull-down transistor,
wherein a common p-type source/drain region of the second p-type pass-gate transistor and the second p-type pull-up transistor and a common n-type source/drain region of the second n-type pass-gate transistor and the second n-type pull-down transistor are electrically connected to form a second storage node, and
wherein the second storage node is further electrically connected to a common gate structure of the first p-type pull-up transistor and the first n-type pull-down transistor.

9. The structure of claim 8, further comprising silicide bridges electrically connecting the common p-type source/drain region of the first p-type pass-gate transistor and the first p-type pull-up transistor to the common n-type source/drain region of the first n-type pass-gate transistor and the first n-type pull-down transistor and electrically connecting the common p-type source/drain region of the second p-type pass-gate transistor and the second p-type pull-up transistor to the common n-type source/drain region of the second n-type pass-gate transistor and the second n-type pull-down transistor.

10. The structure of claim 9, wherein each silicide bridge comprises a silicide layer above a pn junction that is between adjacent epitaxial source/drain regions that have p-type conductivity and n-type conductivity, respectively and above one of a semiconductor extension between the first semiconductor body and the second semiconductor body and a shallow trench isolation region.

11. The structure of claim 8, further comprising contact straps electrically connecting the common p-type source/drain region of the first p-type pass-gate transistor and the first p-type pull-up transistor to the common n-type source/drain region of the first n-type pass-gate transistor and the first n-type pull-down transistor and further electrically connecting the common p-type source/drain region of the second p-type pass-gate transistor and the second p-type pull-up transistor to the common n-type source/drain region of the second n-type pass-gate transistor and the second n-type pull-down transistor.

12. The structure of claim 8,
wherein a p-type source/drain region of the first p-type pass-gate transistor is electrically connected to an n-type source/drain region of the first n-type pass-gate transistor and further to the first bitline, and
wherein a p-type source/drain region of the second p-type pass-gate transistor is electrically connected to an n-type source/drain region of the second n-type pass-gate transistor and further to the second bitline, and
wherein any of silicide bridges and contact straps electrically connect the p-type source/drain region of the first p-type pass-gate transistor to the n-type source/drain region of the first n-type pass-gate transistor and the p-type source/drain region of the second p-type pass-gate transistor to the n-type source/drain region of the second n-type pass-gate transistor.

13. The structure of claim 8, wherein a common p-type source/drain region of the first p-type pull-up transistor and the second p-type pull-up transistor is electrically isolated from a common n-type source/drain region of the first n-type pull-down transistor and the second n-type pull-down transistor.

14. The structure of claim 8, further comprising gate cut isolation regions electrically isolating first and second sections of a common gate structure of the first p-type pass-gate transistor and the first n-type pass-gate transistor and further electrically isolating first and second sections of a common gate structure of the second p-type pass-gate transistor and the second n-type pass-gate transistor.

15. The structure of claim 8,
wherein the memory cell is one memory cell in a given row and a given column of an array of memory cells arranged in columns and rows on the substrate,
wherein, in each row, first semiconductor bodies of the memory cells are in end-to-end alignment and second semiconductor bodies of the memory cells are adjacent and parallel to the first semiconductor bodies and in end-to-end alignment, and
wherein, in each column, any two adjacent memory cells are symmetrically oriented and electrically connected at one of adjacent common p-type source/drain regions of first and second pull-up transistors and adjacent common n-type source/drain regions of first and second n-type pull-down transistors.

16. A structure comprising
a substrate; and
a memory cell on the substrate and comprising:
a first semiconductor body;
a second semiconductor body adjacent and parallel to the first semiconductor body;
four gate structures perpendicular to and traversing the first semiconductor body and the second semiconductor body;
four p-type transistors on the first semiconductor body, wherein the four p-type transistors comprise: a first p-type pass-gate transistor; a first p-type pull-up transistor; a second p-type pull-up transistor; and a second p-type pass-gate transistor;
four n-type transistors on the second semiconductor body, wherein the four n-type transistors comprise: a first n-type pass-gate transistor; a first n-type pull-down transistor; a second n-type pull-down transistor; and a second n-type pass-gate transistor, and wherein each one of the four gate structures is common to one of the p-type transistors and an adjacent one of the n-type transistors; and
silicide bridges electrically connecting a common p-type source/drain region of the first p-type pass-gate transistor and the first p-type pull-up transistor to a common n-type source/drain region of the first n-type pass-gate transistor and the first n-type pull-down transistor to form a first storage node and further electrically connecting a common p-type source/drain region of the second p-type pass-gate transistor and the second p-type pull-up transistor to a common n-type source/drain region of the second n-type pass-gate transistor and the second n-type pull-down transistor to form a second storage node.

17. The structure of claim 16,
wherein the first p-type pass-gate transistor and the first p-type pull-up transistor are connected in series between a first bitline and a first voltage rail,
wherein the second p-type pull-up transistor and the second p-type pass-gate transistor are connected in series between the first voltage rail and a second bitline,
wherein the first n-type pass-gate transistor and the first n-type pull-down transistor are connected in series between the first bitline and a second voltage rail,
wherein the second n-type pull-down transistor and a second n-type pass-gate transistor are connected in series between the second voltage rail and the second bitline,
wherein the first storage node is further electrically connected to a common gate structure of the second p-type pull-up transistor and the second n-type pull-down transistor, and
wherein the second storage node is further electrically connected to a common gate structure of the first p-type pull-up transistor and the first n-type pull-down transistor.

18. The structure of claim 17,
wherein a p-type source/drain region of the first p-type pass-gate transistor is electrically connected to an n-type source/drain region of the first n-type pass-gate transistor and further to the first bitline,
wherein a p-type source/drain region of the second p-type pass-gate transistor is electrically connected to an n-type source/drain region of the second n-type pass-gate transistor and further to the second bitline,
wherein any of additional silicide bridges and contact straps electrically connect the p-type source/drain region of the first p-type pass-gate transistor to the n-type source/drain region of the first n-type pass-gate transistor and the p-type source/drain region of the second p-type pass-gate transistor to the n-type source/drain region of the second n-type pass-gate transistor, and
wherein a common p-type source/drain region of the first p-type pull-up transistor and the second p-type pull-up transistor is electrically isolated from a common n-type source/drain region of the first n-type pull-down transistor and the second n-type pull-down transistor.

19. The structure of claim 17, further comprising gate cut isolation regions electrically isolating first and second sections of a common gate structure of the first p-type pass-gate transistor and the first n-type pass-gate transistor and further electrically isolating first and second sections of a common gate structure of the second p-type pass-gate transistor and the second n-type pass-gate transistor.

20. The structure of claim 17,
wherein the memory cell is one memory cell in a given row and a given column of an array of memory cells arranged in columns and rows in the substrate,
wherein, in each row, first semiconductor bodies of the memory cells are in end-to-end alignment and second semiconductor bodies of the memory cells are adjacent and parallel to the first semiconductor bodies and in end-to-end alignment, and
wherein, in each column, any two adjacent memory cells are symmetrically oriented and electrically connected at one of adjacent common p-type source/drain regions of first and second pull-up transistors and adjacent common n-type source/drain regions of first and second n-type pull-down transistors.

* * * * *